(12) United States Patent
Kimura et al.

(10) Patent No.: US 8,883,950 B2
(45) Date of Patent: Nov. 11, 2014

(54) SILICONE RESIN COMPOSITION, ENCAPSULATING MATERIAL, AND LIGHT EMITTING DIODE DEVICE

(75) Inventors: Ryuichi Kimura, Osaka (JP); Munehisa Mitani, Osaka (JP)

(73) Assignee: Nitto Denko Corporation, Osaka (JP)

( * ) Notice: Subject to any disclaimer, the term of this patent is extended or adjusted under 35 U.S.C. 154(b) by 100 days.

(21) Appl. No.: 13/564,932

(22) Filed: Aug. 2, 2012

(65) Prior Publication Data
US 2013/0032852 A1 Feb. 7, 2013

(30) Foreign Application Priority Data
Aug. 4, 2011 (JP) ................................ 2011-170805

(51) Int. Cl.
| | | |
|---|---|---|
| *C08G 77/20* | (2006.01) | |
| *C08L 83/04* | (2006.01) | |
| *H01L 23/29* | (2006.01) | |
| *C08K 5/5425* | (2006.01) | |
| *C08G 77/12* | (2006.01) | |
| *C08G 77/16* | (2006.01) | |
| *C08K 5/5435* | (2006.01) | |

(52) U.S. Cl.
CPC ............... *C08L 83/04* (2013.01); *C08K 5/5425* (2013.01); *C08G 77/20* (2013.01); *C08G 77/12* (2013.01); *H01L 23/296* (2013.01); *C08G 77/16* (2013.01); *C08K 5/5435* (2013.01)

USPC ................... 528/15; 528/31; 528/32; 528/43; 428/447

(58) Field of Classification Search
USPC ............................ 528/15, 31, 32, 43; 428/447
See application file for complete search history.

(56) References Cited

U.S. PATENT DOCUMENTS

| | | | |
|---|---|---|---|
| 7,125,948 B2 * | 10/2006 | Kozakai et al. .................. | 528/32 |
| 2007/0032595 A1 | 2/2007 | Yamakawa et al. | |
| 2008/0160322 A1 * | 7/2008 | Mochizuki et al. ........... | 428/447 |
| 2010/0148378 A1 | 6/2010 | Katayama et al. | |

FOREIGN PATENT DOCUMENTS

| | | |
|---|---|---|
| EP | 2 463 334 A1 | 6/2012 |
| EP | 2 530 105 A1 | 12/2012 |
| JP | 2010-265436 A | 11/2010 |

OTHER PUBLICATIONS

European Search Report issued in corresponding EP Application No. 12178445.8, dated Nov. 5, 2013.

* cited by examiner

*Primary Examiner* — Margaret Moore
(74) *Attorney, Agent, or Firm* — Sughrue Mion, PLLC

(57) ABSTRACT

A silicone resin composition contains a silicon-containing component including a silicon atom to which a monovalent hydrocarbon group selected from a saturated hydrocarbon group and an aromatic hydrocarbon group is bonded and a silicon atom to which an alkenyl group is bonded. The number of moles of alkenyl group per 1 g of the silicon-containing component is 200 to 2000 μmol/g.

5 Claims, 2 Drawing Sheets

1

(a)

(b)

(c)

1

SILICONE RESIN COMPOSITION, ENCAPSULATING MATERIAL, AND LIGHT EMITTING DIODE DEVICE

CROSS-REFERENCE TO RELATED APPLICATION

The present application claims priority from Japanese Patent Application No. 2011-170805 filed on Aug. 4, 2011, the contents of which are hereby incorporated by reference into this application.

BACKGROUND OF THE INVENTION

1. Field of the Invention

The present invention relates to a silicone resin composition, an encapsulating material, and a light emitting diode device, to be specific, to a light emitting diode device, an encapsulating material used therein, and a silicone resin composition serving as the encapsulating material.

2. Description of Related Art

Conventionally, a light emitting diode device, as a light emitting device capable of emitting high-energy light, has been known. The light emitting diode device includes a light emitting diode element and an encapsulating layer which encapsulates the light emitting diode element.

As an encapsulating material for forming the encapsulating layer, for example, a silicone resin composition prepared in the following manner has been considered (ref: for example, Example 1 in Japanese Unexamined Patent Publication No. 2010-265436).

That is, after mixing 100 g (8.70 mmol) of a dual-end silanol type silicone resin, 0.77 g (5.20 mmol) of a vinyltrimethoxysilane, and 0.14 g (0.59 mmol) of a (3-glycidoxypropyl)trimethoxysilane, 0.19 mL of a methanol solution of tetramethylammonium hydroxide is added thereto. In addition, 2.19 g of an organohydrogensiloxane and 0.025 mL of a platinum-1,3-divinyl-1,1,3,3-tetramethyldisiloxane complex are added to the obtained mixture to prepare a silicone resin composition.

In Japanese Unexamined Patent Publication No. 2010-265436, the silicone resin composition is applied on a polyester film to be heated at 135° C., so that a sheet in a semi-cured state is prepared. Thereafter, a board mounted with a light emitting diode element is covered with the sheet to be heated at 160° C., so that the sheet is completely cured. In this way, a resin encapsulating article (an encapsulating layer) which encapsulates the light emitting diode element is formed to fabricate a light emitting diode device.

SUMMARY OF THE INVENTION

However, in the silicone resin composition described in Japanese Unexamined Patent Publication No. 2010-265436, the number of moles of vinyl group per 1 g of the silicone resin composition is relatively low (50 μmol/g in Example 1 in Japanese Unexamined Patent Publication No. 2010-265436). Therefore, the temperature of the resin encapsulating article is increased by heat generation of the light emitting diode element along with light emission thereof, so that a bleeding in the resin encapsulating article may occur. As a result, there is a disadvantage that the appearance of the light emitting diode device is damaged.

It is an object of the present invention to provide a silicone resin composition having an excellent heat resistance, an encapsulating material made of the silicone resin composition, and a light emitting diode device including an encapsulating layer formed from the encapsulating material and having an excellent appearance.

A silicone resin composition of the present invention contains a silicon-containing component including a silicon atom to which a monovalent hydrocarbon group selected from a saturated hydrocarbon group and an aromatic hydrocarbon group is bonded and a silicon atom to which an alkenyl group is bonded, wherein the number of moles of alkenyl group per 1 g of the silicon-containing component is 200 to 2000 μmol/g.

In the silicone resin composition of the present invention, it is preferable that the silicone resin composition is prepared from a material component that contains the silicon-containing component containing a silicon compound containing both an alkenyl group-a silanol condensation reactive functional group, which contains both an alkenyl group and a silanol condensation reactive functional group, a polysiloxane containing silanol groups at both ends, and an organopolysiloxane containing no alkenyl group/containing a hydrosilyl group, which does not contain an alkenyl group and contains a hydrosilyl group; a silicon compound containing both an epoxy group-a silanol condensation reactive functional group, which contains both an epoxy group and a silanol condensation reactive functional group; a condensation catalyst; and an addition catalyst.

In the silicone resin composition of the present invention, it is preferable that the silicone resin composition is prepared from a material component that contains the silicon-containing component containing an organopolysiloxane containing both an alkenyl group-a hydrosilyl group, which contains both an alkenyl group and a hydrosilyl group, and an organopolysiloxane containing no alkenyl group/containing a hydrosilyl group, which does not contain an alkenyl group and contains a hydrosilyl group; a hydrosilylation catalyst; and a hydrosilylation retarder.

An encapsulating material of the present invention is made of the above-described silicone resin composition.

In the encapsulating material of present invention, it is preferable that the encapsulating material is in a semi-cured state.

In the encapsulating material of present invention, it is preferable that the encapsulating material is formed into a sheet shape.

A light emitting diode device of the present invention includes a light emitting diode element and an encapsulating layer which is formed from the above-described encapsulating material and encapsulates the light emitting diode element.

In the silicone resin composition of the present invention, the number of moles of alkenyl group per 1 g of the silicon-containing component is within a specific range, so that the encapsulating material of the present invention made of the silicone resin composition has an excellent heat resistance.

Therefore, in the light emitting diode device of the present invention, the encapsulating layer formed from the encapsulating material has an excellent heat resistance, so that even when the light emitting diode element generates heat along with the light emission thereof, the bleeding in the encapsulating layer can be suppressed. As a result, the light emitting diode device has an excellent appearance.

DETAILED DESCRIPTION OF THE INVENTION

Figure 1:
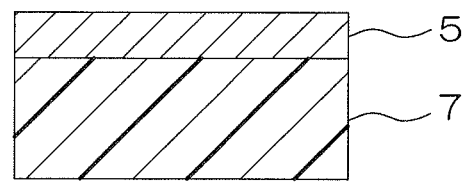
FIG. 1 shows a sectional view for illustrating one embodiment of an encapsulating sheet formed from an encapsulating material of the present invention.

A silicone resin composition of the present invention is prepared from a material component that contains a silicon-containing component including a silicon atom to which a monovalent hydrocarbon group selected from a saturated hydrocarbon group and an aromatic hydrocarbon group is bonded and a silicon atom to which an alkenyl group is bonded. The silicone resin composition of the present invention is, for example, a condensation/addition reaction curable type silicone resin composition which can undergo a condensation reaction and an addition reaction.

The silicon-containing component may contain, as a whole, the silicon atom to which the above-described monovalent hydrocarbon group is bonded and the silicon atom to which the above-described alkenyl group is bonded.

That is, the silicon-containing component includes, for example, a hydrocarbon group-bonded silicon-containing compound, which does not contain the silicon atom to which the alkenyl group is bonded and contains the silicon atom to which the above-described monovalent hydrocarbon group is bonded, and an alkenyl group-bonded silicon-containing compound, which does not contain the silicon atom to which the above-described monovalent hydrocarbon group is bonded and contains the silicon atom to which the alkenyl group is bonded.

Alternatively, the silicon-containing component includes, for example, a compound containing both hydrocarbon group-bonded/alkenyl group-bonded silicons, which contains both the silicon atom to which the above-described monovalent hydrocarbon group is bonded and the silicon atom to which the alkenyl group is bonded. In addition, the silicon-containing component may include, for example, the hydrocarbon group-bonded silicon-containing compound and/or the alkenyl group-bonded silicon-containing compound, and the compound containing both hydrocarbon group-bonded/alkenyl group-bonded silicons.

Examples of the material component include a first material component and a second material component.

The first material component includes, for example, a silicon compound containing both an alkenyl group-a silanol condensation reactive functional group (the alkenyl group-bonded silicon-containing compound), a polysiloxane containing silanol groups at both ends (the hydrocarbon group-bonded silicon-containing compound), an organopolysiloxane containing no alkenyl group/containing a hydrosilyl group (the hydrocarbon group-bonded silicon-containing compound), a silicon compound containing both an epoxy group-a silanol condensation reactive functional group, a condensation catalyst, and an addition catalyst.

In the first material component, the silicon compound containing both an alkenyl group-a silanol condensation reactive functional group, the polysiloxane containing silanol groups at both ends, and the silicon compound containing both an epoxy group-a silanol condensation reactive functional group are condensation materials (materials subjected to a silanol condensation reaction) and the silicon compound containing both an alkenyl group-a silanol condensation reactive functional group and the organopolysiloxane containing no alkenyl group/containing a hydrosilyl group are addition materials (materials subjected to a hydrosilylation addition reaction).

The silicon compound containing both an alkenyl group-a silanol condensation reactive functional group is a silicon compound which contains both an alkenyl group and a silanol condensation reactive functional group and is, to be specific, for example, represented by the following general formula (1).

General Formula (1):

$(X^1)_3Si$—$R^1$    (1)

(where, in general formula (1), $R^1$ represents an alkenyl group and $X^1$ represents a halogen atom, an alkoxy group, a phenoxy group, or an acetoxy group. $X^1$ may be the same or different from each other.)

In the above-described general formula (1), the alkenyl group represented by $R^1$ is, for example, a straight chain or branched chain ethylenically unsaturated hydrocarbon group and examples thereof include a monovalent substituted or unsubstituted alkenyl group. To be specific, an example thereof includes an alkenyl group such as a terminal alkenyl group having a double bond at an end of $R^1$ and an alkenyl group having a double bond in the middle of $R^1$. The number of carbon atoms of the alkenyl group is, for example, 2 to 10, or preferably 2 to 5.

Examples of the terminal alkenyl group include a vinyl group, an allyl group (a 2-propenyl group), a 3-butenyl group, a 4-pentenyl group, a 5-hexenyl group, a 6-heptenyl group, and a 7-octenyl group.

Examples of the alkenyl group having a double bond in the middle of $R^1$ include a 1-propenyl group, a 1-butenyl group, a 2-butenyl group, a 1-pentenyl group, a 2-pentenyl group, a 3-pentenyl group, a 1-hexenyl group, a 2-hexenyl group, a 3-hexenyl group, a 4-hexenyl group, a 1-heptenyl group, a 2-heptenyl group, a 3-heptenyl group, a 4-heptenyl group, a 5-heptenyl group, a 1-octenyl group, a 2-octenyl group, a 3-octenyl group, a 4-octenyl group, a 5-octenyl group, and a 6-octenyl group.

As the alkenyl group, in view of reactivity with a hydrosilyl group in the organopolysiloxane containing no alkenyl group/containing a hydrosilyl group, preferably, a terminal alkenyl group having 2 to 10 carbon atoms is used, more preferably, a terminal alkenyl group having 2 to 5 carbon atoms is used, or more preferably, a vinyl group is used.

$X^1$ in the above-described general formula (1) is a leaving group in the silanol condensation reaction and $SiX^1$ group in the above-described general formula (1) is a reactive functional group in the silanol condensation reaction, that is, a silanol condensation reactive functional group.

In the above-described general formula (1), examples of the halogen atom represented by $X^1$ include bromine, chlorine, fluorine, and iodine.

In the above-described general formula (1), examples of the alkoxy group represented by $X^1$ include an alkoxy group containing a straight chain or branched chain alkyl group having 1 to 6 carbon atoms (such as a methoxy group, an ethoxy group, a propoxy group, an isopropoxy group, a butoxy group, an isobutoxy group, a pentyloxy group, and a hexyloxy group) and an alkoxy group containing a cycloalkyl group having 3 to 6 carbon atoms (such as a cyclopentyloxy group and a cyclohexyloxy group).

In the above-described general formula (1), $X^1$ may be the same or different from each other. Preferably, $X^1$ is the same.

Of the X's in the above-described general formula (1), preferably, an alkoxy group is used, or more preferably, a methoxy group is used.

Examples of the silicon compound containing both an alkenyl group-a silanol condensation reactive functional group include an alkenyl group-containing trialkoxysilane, an alkenyl group-containing trihalogenated silane, an alkenyl group-containing triphenoxysilane, and an alkenyl group-containing triacetoxysilane.

These silicon compounds containing both an alkenyl group-a silanol condensation reactive functional group can be used alone or in combination.

Of the silicon compounds containing both an alkenyl group-a silanol condensation reactive functional group, preferably, an alkenyl group-containing trialkoxysilane is used.

To be specific, examples of the alkenyl group-containing trialkoxysilane include a vinyltrialkoxysilane such as a vinyltrimethoxysilane, a vinyltriethoxysilane, and a vinyltripropoxysilane; an allyltrialkoxysilane such as an allyltrimethoxysilane; and a 3-butenyltrialkoxysilane such as a 3-butenyltrimethoxysilane.

Of the alkenyl group-containing trialkoxysilanes, preferably, a vinyltrialkoxysilane is used, or more preferably, a vinyltrimethoxysilane is used.

The alkenyl group equivalent (that is, the number of moles of alkenyl group per 1 g of the silicon compound containing both an alkenyl group-a silanol condensation reactive functional group or the content of the alkenyl group) in the silicon compound containing both an alkenyl group-a silanol condensation reactive functional group is, for example, 500 to 50000 μmol/g, or preferably 1000 to 10000 μmol/g.

As shown in the above-described general formula (1), the silicon compound containing both an alkenyl group-a silanol condensation reactive functional group contains, in one molecule, one alkenyl group, so that the alkenyl group equivalent in the silicon compound containing both an alkenyl group-a silanol condensation reactive functional group is calculated as the reciprocal [mol/g] of the molecular weight [g/mol] of the silicon compound containing both an alkenyl group-a silanol condensation reactive functional group.

The mixing ratio of the silicon compound containing both an alkenyl group-a silanol condensation reactive functional group is, for example, 0.01 to 90 parts by mass, preferably 0.01 to 50 parts by mass, or more preferably 0.01 to 10 parts by mass with respect to 100 parts by mass of the condensation material.

A commercially available product can be used as the silicon compound containing both an alkenyl group-a silanol condensation reactive functional group. A silicon compound containing both an alkenyl group-a silanol condensation reactive functional group synthesized in accordance with a known method can be also used.

The polysiloxane containing silanol groups at both ends is an organosiloxane which contains silanol groups (SiOH groups) at both ends of a molecule and is, to be specific, represented by the following general formula (2).

General Formula (2):

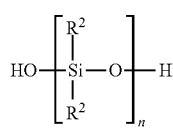

(2)

(where, in general formula (2), $R^2$ represents a monovalent hydrocarbon group selected from a saturated hydrocarbon group and an aromatic hydrocarbon group. "n" represents an integer of 1 or more.)

In the above-described general formula (2), in the monovalent hydrocarbon group represented by $R^2$, examples of the saturated hydrocarbon group include a straight chain or branched chain alkyl group having 1 to 6 carbon atoms (such as a methyl group, an ethyl group, a propyl group, an isopropyl group, a butyl group, an isobutyl group, a pentyl group, and a hexyl group) and a cycloalkyl group having 3 to 6 carbon atoms (such as a cyclopentyl group and a cyclohexyl group).

In the above-described general formula (2), in the monovalent hydrocarbon group represented by $R^2$, an example of the aromatic hydrocarbon group includes an aryl group having 6 to 10 carbon atoms (such as a phenyl group and a naphthyl group).

In the above-described general formula (2), $R^2$ may be the same or different from each other. Preferably, $R^2$ is the same.

As the monovalent hydrocarbon group, preferably, an alkyl group having 1 to 6 carbon atoms and an aryl group having 6 to 10 carbon atoms are used, more preferably, in view of transparency, heat resistance, and light resistance, a methyl group and a phenyl group are used, or particularly preferably, a methyl group is used.

In the above-described general formula (2), "n" is preferably, in view of stability and/or handling ability, an integer of 2 or more, more preferably an integer of 2 to 10000, or particularly preferably an integer of 2 to 1000.

"n" in the above-described general formula (2) is calculated as an average value.

To be specific, examples of the polysiloxane containing silanol groups at both ends include a polydimethylsiloxane containing silanol groups at both ends, a polymethylphenylsiloxane containing silanol groups at both ends, and a polydiphenylsiloxane containing silanol groups at both ends.

These polysiloxanes containing silanol groups at both ends can be used alone or in combination.

Of the polysiloxanes containing silanol groups at both ends, preferably, a polydimethylsiloxane containing silanol groups at both ends is used.

A commercially available product can be used as the polysiloxane containing silanol groups at both ends. A polysiloxane containing silanol groups at both ends synthesized in accordance with a known method can be also used.

The number average molecular weight of the polysiloxane containing silanol groups at both ends is, in view of stability and/or handling ability, for example, 100 to 1000000, or preferably 200 to 100000. The number average molecular weight is calculated by conversion based on standard polystyrene with a gel permeation chromatography. The number average molecular weight of a material, other than the polysiloxane containing silanol groups at both ends, to be described later, is also calculated in the same manner as the description above.

The silanol group equivalent (that is, the number of moles of silanol group per 1 g of the polysiloxane containing silanol groups at both ends or the content of the silanol group) in the polysiloxane containing silanol groups at both ends is, for example, 0.01 to 10 mmol/g, or preferably 0.05 to 2 mmol/g. The silanol group equivalent is measured by a $^1$H-NMR.

The mixing ratio of the polysiloxane containing silanol groups at both ends is, for example, 1 to 99.99 parts by mass, preferably 50 to 99.9 parts by mass, or more preferably 80 to 99.5 parts by mass with respect to 100 parts by mass of the condensation material.

The organopolysiloxane containing no alkenyl group/containing a hydrosilyl group is an organohydrogensiloxane which does not contain an alkenyl group and contains a hydrosilyl group. An example thereof includes an organopolysiloxane such as an organopolysiloxane containing a hydrogen atom in its side chain and an organopolysiloxane containing hydrogen atoms at both ends.

The organopolysiloxane containing a hydrogen atom in its side chain is an organohydrogenpolysiloxane having a hydrogen atom as a side chain which branches off from the main chain and is, for example, represented by the following general formula (3).

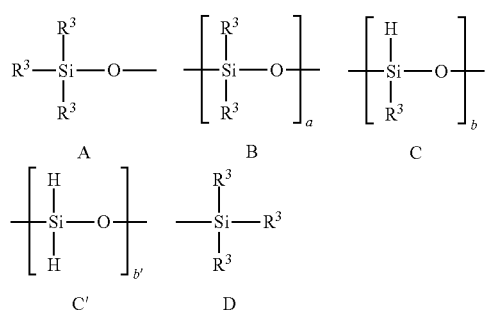

(where, in general formula (3), A, B, C, C', and D represent a constituent unit; A and D represent an end unit; and B, C, and C' represent a repeating unit. $R^3$ represents a monovalent hydrocarbon group selected from a saturated hydrocarbon group and an aromatic hydrocarbon group. "a" represents an integer of 0 or more, "b" represents an integer of 1 or more, and "b'" represents an integer of 0 or more.)

The organopolysiloxane containing a hydrogen atom in its side chain consists of A, B, C, C', and D.

The monovalent hydrocarbon group represented by $R^3$ in general formula (3) may be the same or different from each other. Preferably, the monovalent hydrocarbon group represented by $R^3$ is the same.

In the monovalent hydrocarbon group represented by $R^3$, examples of the saturated hydrocarbon group and the aromatic hydrocarbon group include the same saturated hydrocarbon group and aromatic hydrocarbon group as those illustrated by $R^2$ in the above-described general formula (2). As the monovalent hydrocarbon group, preferably, a methyl group and a phenyl group are used, or more preferably, a methyl group is used. "a" represents, in view of reactivity and stability, preferably an integer of 1 or more, more preferably an integer of 1 to 10000, particularly preferably an integer of 2 to 5000, or most preferably an integer of 5 to 100.

"b" represents preferably an integer of 2 or more and also represents, in view of reactivity and stability, preferably an integer of 1 to 10000, more preferably an integer of 2 to 1000, or particularly preferably an integer of 5 to 100.

"b'" represents preferably an integer of 0 to 1000, or more preferably an integer of 0 to 100.

To be specific, when "b'" is 0 in the above-described general formula (3), preferably, examples of the organopolysiloxane containing a hydrogen atom in its side chain include a methylhydrogenpolysiloxane, a dimethylpolysiloxane-co-methylhydrogenpolysiloxane, an ethylhydrogenpolysiloxane, and a methylhydrogenpolysiloxane-co-methylphenylpolysiloxane.

The number average molecular weight of the organopolysiloxane containing a hydrogen atom in its side chain is, for example, 100 to 1000000.

The organopolysiloxane containing hydrogen atoms at both ends is an organohydrogenpolysiloxane having hydrogen atoms at both ends of the main chain and is represented by the following general formula (4).

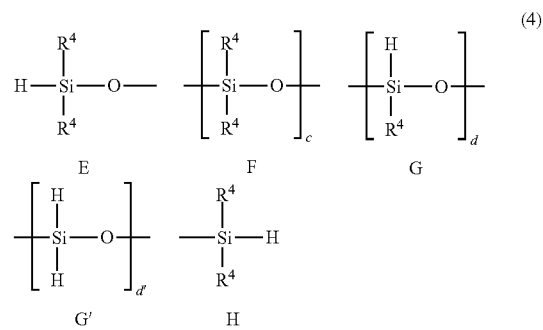

(where, in general formula (4), E, F, G, G', and H represent a constituent unit; E and H represent an end unit; and F, G, and G' represent a repeating unit. $R^4$ represents a monovalent hydrocarbon group selected from a saturated hydrocarbon group and an aromatic hydrocarbon group. "c" represents an integer of 0 or more, "d" represents an integer of 0 or more, and "d'" represents an integer of 0 or more.)

The organopolysiloxane containing hydrogen atoms at both ends consists of E, F, G, G', and H.

In general formula (4), in the monovalent hydrocarbon group represented by $R^4$, examples of the saturated hydrocarbon group and the aromatic hydrocarbon group include the same saturated hydrocarbon group and aromatic hydrocarbon group as those illustrated by $R^2$ in the above-described general formula (2). As the monovalent hydrocarbon group, preferably, a methyl group and a phenyl group are used, or more preferably, a methyl group is used.

"c" represents, in view of reactivity and stability, preferably an integer of 1 or more, more preferably an integer of 1 to 10000, or particularly preferably an integer of 1 to 5000.

"d" represents, in view of reactivity and stability, preferably an integer of 1 or more, more preferably an integer of 1 to 10000, or particularly preferably an integer of 1 to 5000.

"d'" represents preferably an integer of 0 to 1000, or more preferably an integer of 0 to 100.

The organopolysiloxane containing hydrogen atoms at both ends is, for example, when "d" or "d'" in general formula (4) is 1 or more, an organopolysiloxane containing both a hydrogen atom in its side chain and hydrogen atoms at both ends, which contains a hydrogen atom in the side chain branched off from the main chain and hydrogen atoms at both ends of the main chain. To be specific, when "d" is 1 and "d'" is 0, examples of the organopolysiloxane containing hydrogen atoms at both ends include a methylhydrogenpolysiloxane containing hydrosilyl groups at both ends, (dimethylpolysiloxane-co-methylhydrogenpolysiloxane) containing hydrosilyl groups at both ends, an ethylhydrogenpolysiloxane containing hydrosilyl groups at both ends, and a (methylhydrogenpolysiloxane-co-methylphenylpolysiloxane) containing hydrosilyl groups at both ends.

The organopolysiloxane containing hydrogen atoms at both ends is, for example, when "d" and "d'" in general formula (4) are 0, an organopolysiloxane containing no hydrogen atom in its side chain/containing hydrogen atoms at both ends, which does not contain a hydrogen atom in the side chain branched off from the main chain and contains hydrogen atoms at both ends of the main chain. To be specific, examples of the organopolysiloxane containing hydrogen atoms at both ends include a polydimethylsiloxane containing hydrosilyl groups at both ends, a polymethylphenylsiloxane containing hydrosilyl groups at both ends, and a polydiphenylsiloxane containing hydrosilyl groups at both ends.

As the organopolysiloxane containing hydrogen atoms at both ends, preferably, an organopolysiloxane containing no hydrogen atom in its side chain/containing hydrogen atoms at both ends is used.

The number average molecular weight of the organopolysiloxane containing hydrogen atoms at both ends is, in view of stability and/or handling ability, for example, 100 to 1000000, or more preferably 100 to 100000.

These organopolysiloxanes containing no alkenyl group/containing a hydrosilyl group can be used alone or in combination.

Of the organopolysiloxanes containing no alkenyl group/containing a hydrosilyl group, preferably, an organopolysiloxane containing a hydrogen atom in its side chain is used, or more preferably, a dimethylpolysiloxane-co-methyihydrogenpolysiloxane is used.

The viscosity (at 25° C.) of the organopolysiloxane containing no alkenyl group/containing a hydrosilyl group is, for example, 10 to 100000 mPa·s, or preferably 20 to 50000 mPa·s. The viscosity can be measured using a B-type viscometer.

The hydrosilyl group equivalent (that is, the number of moles of hydrosilyl group per 1 g of the organopolysiloxane containing no alkenyl group/containing a hydrosilyl group or the content of the hydrosilyl group) in the organopolysiloxane containing no alkenyl group/containing a hydrosilyl group is, in view of toughness and flexibility of the cured product, for example, 0.005 to 10 mmol/g, or preferably 0.01 to 8 mmol/g. The hydrosilyl group equivalent is measured by a $^1$H-NMR.

When the hydrosilyl group equivalent in the organopolysiloxane containing no alkenyl group/containing a hydrosilyl group is less than 0.005 mmol/g, the toughness of the cured product may be insufficient. When the hydrosilyl group equivalent exceeds 10 mmol/g, the flexibility of the cured product may be insufficient.

A commercially available product can be used as the organopolysiloxane containing no alkenyl group/containing a hydrosilyl group. An organopolysiloxane containing no alkenyl group/containing a hydrosilyl group synthesized in accordance with a known method can be also used.

The mixing ratio of the organopolysiloxane containing no alkenyl group/containing a hydrosilyl group is, though depending on the molar ratio of the alkenyl group ($R^1$ in the above-described general formula (1)) in the silicon compound containing both an alkenyl group-a silanol condensation reactive functional group to the hydrosilyl group (SiH group) in the organopolysiloxane containing no alkenyl group/containing a hydrosilyl group, for example, 10 to 10000 parts by mass, or preferably 100 to 1000 parts by mass with respect to 100 parts by mass of the silicon compound containing both an alkenyl group-a silanol condensation reactive functional group.

The molar ratio ($R^1$/the SiH group) of the alkenyl group ($R^1$ in the above-described general formula (1)) in the silicon compound containing both an alkenyl group-a silanol condensation reactive functional group to the hydrosilyl group (the SiH group) in the organopolysiloxane containing no alkenyl group/containing a hydrosilyl group is, for example, 20/1 to 0.05/1, preferably 20/1 to 0.1/1, more preferably 10/1 to 0.1/1, particularly preferably 10/1 to 0.2/1, or most preferably 5/1 to 0.2/1. The molar ratio ($R^1$/the SiH group) can be also set to be, for example, less than 1/1 and not less than 0.05/1.

When the molar ratio exceeds 20/1, there may be a case where a semi-cured product having an appropriate toughness is not obtained when the silicone resin composition is brought into a semi-cured state. When the molar ratio is below 0.05/1, the mixing proportion of the organopolysiloxane containing no alkenyl group/containing a hydrosilyl group is excessively large, so that the heat resistance and the toughness of the obtained encapsulating material may be insufficient.

When the molar ratio is less than 1/1 and not less than 0.05/1, in allowing the silicone resin composition to be in a semi-cured state, the silicone resin composition can be quickly transferred into a semi-cured state, compared to the silicone resin composition whose molar ratio is 20/1 to 1/1.

The silicon compound containing both an epoxy group-a silanol condensation reactive functional group is a silicon compound which contains both an epoxy group and a silanol condensation reactive functional group and is, to be specific, represented by the following general formula (5).

General Formula (5):

(where, in general formula (5), $R^5$ represents a group having an epoxy structure and $X^2$ represents a halogen atom, an alkoxy group, a phenoxy group, or an acetoxy group. $X^2$ may be the same or different from each other.)

In general formula (5), examples of the group having an epoxy structure represented by $R^5$ include an epoxy group, a glycidyl ether group, and an epoxycycloalkyl group such as an epoxycyclohexyl group.

Of the groups having an epoxy structure, preferably, a glycidyl ether group is used. To be specific, the glycidyl ether group is a glycidoxyalkyl group represented by the following general formula (6).

General Formula (6):

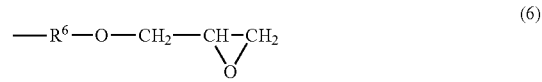

(where, in general formula (6), $R^6$ represents a divalent hydrocarbon group selected from a saturated hydrocarbon group and an aromatic hydrocarbon group.)

In the above-described general formula (6), in the divalent hydrocarbon group represented by $R^6$, examples of the saturated hydrocarbon group include an alkylene group having 1 to 6 carbon atoms (such as a methylene group, an ethylene group, a propylene group, and a butylene group) and a cycloalkylene group having 3 to 8 carbon atoms (such as a cyclopentylene group and a cyclohexylene group).

In the above-described general formula (6), in the divalent hydrocarbon group represented by $R^6$, an example of the aromatic hydrocarbon group includes an arylene group having 6 to 10 carbon atoms (such as a phenylene group and a naphthylene group).

As the divalent hydrocarbon group, preferably, an alkylene group having 1 to 6 carbon atoms is used, or more preferably, a propylene group is used.

To be specific, examples of the glycidyl ether group include a glycidoxymethyl group, a glycidoxyethyl group, a glycidoxypropyl group, a glycidoxycyclohexyl group, and a glycidoxyphenyl group.

Of the glycidyl ether groups, preferably, a glycidoxypropyl group is used.

$X^2$ in the above-described general formula (6) is a leaving group in the silanol condensation reaction. $SiX^2$ group in the above-described general formula (6) is a reactive functional group (a silanol condensation reactive functional group) in the silanol condensation reaction.

In the above-described general formula (6), an example of the halogen atom represented by $X^2$ includes the same halogen atom as that represented by $X^1$ in the above-described general formula (1).

In the above-described general formula (6), an example of the alkoxy group represented by $X^2$ includes the same alkoxy group as that represented by $X^1$ in the above-described general formula (1).

In the above-described general formula (6), $X^2$ may be the same or different from each other. Preferably, $X^2$ is the same.

As $X^2$ in the above-described general formula (6), preferably, an alkoxy group is used, or more preferably, a methoxy group is used.

Examples of the silicon compound containing both an epoxy group-a silanol condensation reactive functional group include an epoxy group-containing trialkoxysilane, an epoxy group-containing trihalogenated silane, an epoxy group-containing triphenoxysilane, and an epoxy group-containing triacetoxysilane.

These silicon compounds containing both an epoxy group-a silanol condensation reactive functional group can be used alone or in combination.

Of the silicon compounds containing both an epoxy group-a silanol condensation reactive functional group, preferably, an epoxy group-containing trialkoxysilane is used.

To be specific, examples of the epoxy group-containing trialkoxysilane include a glycidoxyalkyltrimethoxysilane such as a glycidoxymethyltrimethoxysilane, a (2-glycidoxyethyl)trimethoxysilane, and a (3-glycidoxypropyl)trimethoxysilane; a glycidoxyalkyltriethoxysilane such as a (3-glycidoxypropyl)triethoxysilane; a glycidoxyalkyltripropoxysilane such as a (3-glycidoxypropyl)tripropoxysilane; and a glycidoxyalkyltriisopropoxysilane such as a (3-glycidoxypropyl)triisopropoxysilane.

Of the epoxy group-containing trialkoxysilanes, preferably, a glycidoxyalkyltrimethoxysilane is used, or more preferably, a (3-glycidoxypropyl)trimethoxysilane is used.

The epoxy group equivalent (that is, the number of moles of epoxy group per 1 g of the silicon compound containing both an epoxy group-a silanol condensation reactive functional group or the content of the epoxy group) in the silicon compound containing both an epoxy group-a silanol condensation reactive functional group is, for example, 500 to 50000 μmol/g, or preferably 1000 to 10000 μmol/g.

As shown in the above-described general formula (6), the silicon compound containing both an epoxy group-a silanol condensation reactive functional group contains, in one molecule, one group having an epoxy structure, so that the epoxy group equivalent in the silicon compound containing both an epoxy group-a silanol condensation reactive functional group is calculated as the reciprocal [mol/g] of the molecular weight [g/mol] of the silicon compound containing both an epoxy group-a silanol condensation reactive functional group.

The mixing ratio of the silicon compound containing both an epoxy group-a silanol condensation reactive functional group is, for example, 0.01 to 90 parts by mass, preferably 0.01 to 50 parts by mass, or more preferably 0.01 to 5 parts by mass with respect to 100 parts by mass of the condensation material.

A commercially available product can be used as the silicon compound containing both an epoxy group-a silanol condensation reactive functional group. A silicon compound containing both an epoxy group-a silanol condensation reactive functional group synthesized in accordance with a known method can be also used.

The molar ratio (SiOH/(SiX' +SiX$^2$)) of the silanol group (the SiOH group) in the polysiloxane containing silanol groups at both ends to the silanol condensation reactive functional group (the SiX$^1$ group and the SiX$^2$ group) in the silicon compound containing both an alkenyl group-a silanol condensation reactive functional group and the silicon compound containing both an epoxy group-a silanol condensation reactive functional group is, for example, 20/1 to 0.2/1, or preferably 10/1 to 0.5/1.

When the molar ratio exceeds the above-described range, there may be a case where a semi-cured product having an appropriate toughness is not obtained when the silicone resin composition is brought into a semi-cured state. On the other hand, when the molar ratio is below the above-described range, the mixing proportion of the silicon compound containing both an alkenyl group-a silanol condensation reactive functional group and the silicon compound containing both an epoxy group-a silanol condensation reactive functional group is excessively large, so that the heat resistance of an encapsulating layer to be obtained (described later) may be reduced.

The molar ratio of the silicon compound containing both an epoxy group-a silanol condensation reactive functional group to the silicon compound containing both an alkenyl group-a silanol condensation reactive functional group is, for example, 1/99 to 90/10, preferably 3/97 to 50/50, or more preferably 5/95 to 20/80.

When the molar ratio is within the above-described range, the adhesiveness of a cured product can be improved, while the strength thereof is ensured.

The condensation catalyst is not particularly limited as long as it is a substance capable of improving the reaction rate of the silanol condensation reaction of the silanol group with the silanol condensation reactive functional group (the SiX$^1$ group in the above-described general formula (2) and the SiX$^2$ group in the above-described general formula (5)). Examples of the condensation catalyst include an acid such as hydrochloric acid, acetic acid, formic acid, and sulfuric acid; a base such as potassium hydroxide, sodium hydroxide, potassium carbonate, and tetramethylammonium hydroxide; and a metal such as aluminum, titanium, zinc, and tin.

These condensation catalysts can be used alone or in combination.

Of the condensation catalysts, in view of compatibility and thermal decomposition characteristics, preferably, a base is used, or more preferably, tetramethylammonium hydroxide is used.

The mixing ratio of the condensation catalyst is, for example, 0.1 to 50 mol, or preferably 0.25 to 5 mol with respect to 100 mol of the polysiloxane containing silanol groups at both ends.

The addition catalyst is not particularly limited as long as it is a substance (a hydrosilylation catalyst) capable of improving the reaction rate of the addition reaction (a hydrosilylation addition reaction), that is, the hydrosilylation reaction of the alkenyl group with the hydrosilyl group (the SiH group). An example of the addition catalyst includes a metal catalyst. Examples of the metal catalyst include a platinum catalyst such as platinum black, platinum chloride, chloroplatinic acid, a platinum olefin complex, a platinum carbonyl complex, and platinum acetyl acetate; a palladium catalyst; and a rhodium catalyst.

Of the addition catalysts, in view of compatibility and transparency, preferably, a platinum catalyst is used, or more preferably, a platinum olefin complex is used. To be specific, examples of the addition catalyst include a platinum-1,3-divinyl-1,1,3,3-tetramethyldisiloxane complex and a platinum-divinylsiloxane complex.

These addition catalysts can be used alone or in combination.

Of the addition catalysts, in view of compatibility, transparency, and catalyst activity, preferably, a platinum catalyst is used, or more preferably, a platinum-1,3-divinyl-1,1,3,3-tetramethyldisiloxane complex is used.

The mixing ratio of the addition catalyst is, as the metal amount in the addition catalyst, for example, $1.0 \times 10^{-4}$ to 1.0 parts by mass, preferably $1.0 \times 10^{-4}$ to 0.5 parts by mass, or more preferably $1.0 \times 10^{-4}$ to 0.05 parts by mass with respect to 100 parts by mass of the organopolysiloxane containing no alkenyl group/containing a hydrosilyl group.

As the condensation catalyst and the addition catalyst described above, a condensation catalyst and an addition catalyst in a solid state can be used as they are. Alternatively, in view of handling ability, a condensation catalyst and an addition catalyst can be used as a solution or as a dispersion liquid dissolved or dispersed in a solvent.

Examples of the solvent include water; an alcohol such as methanol and ethanol; and an aromatic hydrocarbon such as toluene.

The silicon compound containing both an alkenyl group-a silanol condensation reactive functional group, the polysiloxane containing silanol groups at both ends, the organopolysiloxane containing no alkenyl group/containing a hydrosilyl group, the silicon compound containing both an epoxy group-a silanol condensation reactive functional group, the condensation catalyst, and the addition catalyst are blended to be stirred and mixed, so that the first material component is prepared.

To prepare the first material component, for example, the above-described materials (the condensation materials and the addition materials) may be blended simultaneously. Alternatively, each of the materials and each of the catalysts can be blended, respectively, at different timings. Furthermore, a part of the components can be added simultaneously and each of the remaining components can be blended thereto, respectively, at different timings.

Of the preparation methods of the first material component, preferably, the following method is used. The condensation materials are first prepared and then, the condensation catalyst is blended into the prepared condensation materials to prepare a mixture. Next, the addition material is blended into the prepared mixture and then, the addition catalyst is blended thereto.

To be specific, after stirring and mixing the silicon compound containing both an alkenyl group-a silanol condensation reactive functional group, the polysiloxane containing silanol groups at both ends, and the silicon compound containing both an epoxy group-a silanol condensation reactive functional group (that is, the condensation materials) at the above-described proportion, the condensation catalyst is blended thereto to be stirred and mixed for, for example, 5 minutes to 24 hours, so that the mixture is prepared.

At the time of blending and stirring, the temperature can be also adjusted to, for example, 0 to 60° C. in order to improve compatibility and handling ability of the condensation materials.

By the above-described mixing, the silanol condensation reaction of the SiOH group in the polysiloxane containing silanol groups at both ends, and the $SiX^1$ group in the silicon compound containing both an alkenyl group-a silanol condensation reactive functional group and the $SiX^2$ group in the silicon compound containing both an epoxy group-a silanol condensation reactive functional group may be partially initiated. The degree of progress of the silanol condensation reaction can be checked by a $^1$H-NMR measurement based on the disappearance degree of the peak derived from the SiOH group.

Thereafter, the pressure in the system (the above-described mixture) is reduced as required, so that a volatile component (a solvent and the like) is removed.

Next, the organopolysiloxane containing no alkenyl group/containing a hydrosilyl group is blended into the prepared mixture of the condensation materials and the condensation catalyst to be stirred for, for example, 1 to 120 minutes.

At the time of blending and stirring, the temperature can be also adjusted to, for example, 0 to 60° C. in order to improve compatibility and handling ability of the mixture and the organopolysiloxane containing no alkenyl group/containing a hydrosilyl group.

Thereafter, the addition catalyst is blended into the system (the above-described mixture) to be stirred for, for example, 1 to 60 minutes.

In this way, the first material component is prepared.

The first material component prepared in this way is, for example, in a liquid state (in an oil state). The prepared first material component is heated thereafter, so that the condensation materials are subjected to the condensation reaction to be brought into a B-stage state (in a semi-cured state). To be specific, the silanol condensation reaction of the silanol group in the polysiloxane containing silanol groups at both ends, the hydrosilyl group in the silicon compound containing both an alkenyl group-a silanol condensation reactive functional group, and the hydrosilyl group in the silicon compound containing both an epoxy group-a silanol condensation reactive functional group is progressed.

Thereafter, by further heating, the addition materials are subjected to the addition reaction to be brought into a C-stage state (in a completely cured state). To be specific, the hydrosilylation reaction of the alkenyl group in the silicon compound containing both an alkenyl group-a silanol condensation reactive functional group and the hydrosilyl group in the organopolysiloxane containing no alkenyl group/containing a hydrosilyl group is progressed.

The second material component includes, for example, an organopolysiloxane containing both an alkenyl group-a hydrosilyl group (a compound containing both hydrocarbon group-bonded/alkenyl group-bonded silicons), an organopolysiloxane containing no alkenyl group/containing a hydrosilyl group (a hydrocarbon group-bonded silicon-containing compound), a hydrosilylation catalyst, and a hydrosilylation retarder.

The organopolysiloxane containing both an alkenyl group-a hydrosilyl group contains both an alkenyl group and a hydrosilyl group (a SiH group, ref: the following general formula (7)). To be specific, examples of the organopolysiloxane containing both an alkenyl group-a hydrosilyl group include an organopolysiloxane containing a hydrogen atom at its end and an alkenyl group in its side chain represented by the following general formula (7), an organopolysiloxane containing an alkenyl group at its end and a hydrogen atom in its side chain represented by the following general formula (8), or an organopolysiloxane containing a hydrogen atom-an alkenyl group in its side chain represented by the following general formula ($^9$).

General Formula (7):

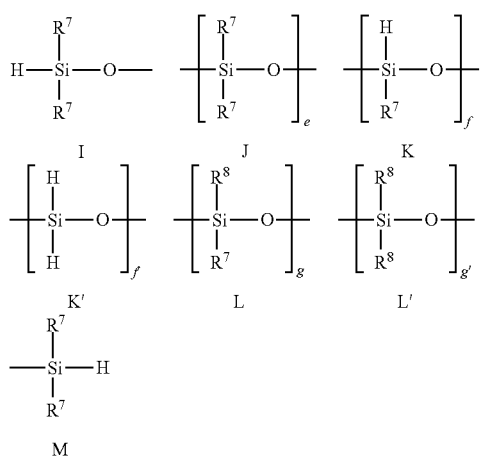

(where, in general formula (7), I, J, K, K', L, L', and M represent a constituent unit; I and M represent an end unit; and J, K, K', L, and L' represent a repeating unit. $R^7$ represents a monovalent hydrocarbon group selected from a saturated hydrocarbon group and an aromatic hydrocarbon group. $R^8$ represents a monovalent alkenyl group. "e" represents an integer of 0 or more, "f" represents an integer of 0 or more, "f'" represents an integer of 0 or more, "g" represents an integer of 2 or more, and "g'" represents an integer of 0 or more.)

General Formula (8):

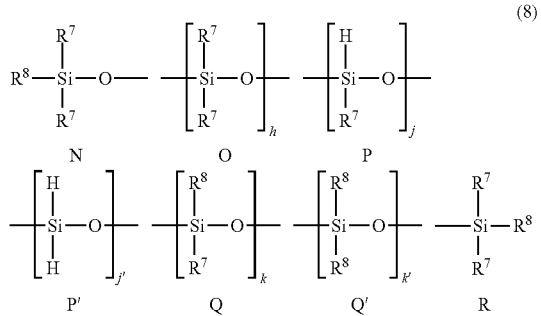

(where, in general formula (8), N, O, P, P', Q, Q', and R represent a constituent unit; N and R represent an end unit; and O, P, P', Q, and Q' represent a repeating unit. $R^7$ represents a monovalent hydrocarbon group selected from a saturated hydrocarbon group and an aromatic hydrocarbon group. $R^8$ represents a monovalent alkenyl group. "h" represents an integer of 0 or more, "j" represents an integer of 2 or more, "j'" represents an integer of 0 or more, "k" represents an integer of 0 or more, and "k'" represents an integer of 0 or more.)

General Formula (9):

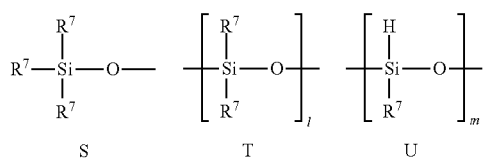

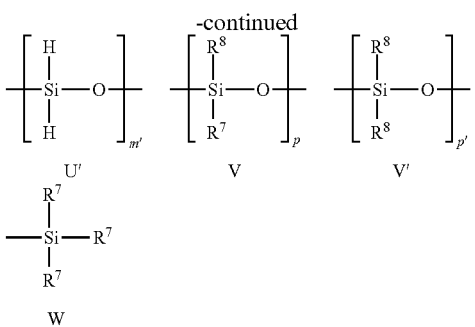

(where, in general formula (9), S, T, U, U', V, V', and W represent a constituent unit; S and W represent an end unit; and T, U, U', V, and V' represent a repeating unit. $R^7$ represents a monovalent hydrocarbon group selected from a saturated hydrocarbon group and an aromatic hydrocarbon group. $R^8$ represents a monovalent alkenyl group. "l" represents an integer of 0 or more, "m" represents an integer of 2 or more, "m'" represents an integer of 0 or more, "p" represents an integer of 2 or more, and "p'" represents an integer of 0 or more.)

In the above-described general formulas (7) to (9), examples of the saturated hydrocarbon group and the aromatic hydrocarbon group represented by $R^7$ include the same saturated hydrocarbon group and aromatic hydrocarbon group as those illustrated by $R^2$ in the above-described general formula (2) of the polysiloxane containing silanol groups at both ends in the first material component. As the monovalent hydrocarbon group, preferably, a methyl group and a phenyl group are used, or more preferably, a methyl group is used.

In the above-described general formulas (7) to (9), the number of carbon atoms of the monovalent hydrocarbon group represented by $R^7$ is preferably 1 to 10.

In the above-described general formulas (7) to (9), $R^7$ may be the same or different from each other. Preferably, $R^7$ is the same.

In the above-described general formulas (7) to (9), an example of the alkenyl group represented by $R^8$ includes the same alkenyl group as that illustrated by $R^1$ in the above-described general formula (1) of the silicon compound containing both an alkenyl group-a silanol condensation reactive functional group in the first material component.

The number of carbon atoms of the alkenyl group is, in view of transparency and heat resistance of the cured product, preferably 2 to 5.

In the above-described general formulas (7) to (9), $R^8$ may be the same or different from each other. Preferably, $R^8$ is the same.

As the alkenyl group, in view of reactivity with the hydrosilyl group, preferably, an alkenyl group having 2 to 5 carbon atoms is used, or more preferably, vinyl is used.

In the above-described general formula (7), "e" represents, in view of reactivity and stability, preferably an integer of 0 to 10000, or more preferably an integer of 0 to 1000.

"f" represents, in view of reactivity and stability, preferably an integer of 0 to 1000, or more preferably an integer of 0 to 100.

"f'" represents, preferably an integer of 0 to 1000, or more preferably an integer of 0 to 100.

"g" represents, in view of reactivity and stability, preferably an integer of 2 to 1000, or more preferably an integer of 2 to 100.

"g'" represents, preferably an integer of 0 to 1000, or more preferably an integer of 0 to 100.

In the above-described general formula (8), "h" represents, in view of reactivity and stability, preferably an integer of 0 to 10000, or more preferably an integer of 1 to 1000.

"j" represents, in view of reactivity and stability, preferably an integer of 2 to 1000, or more preferably an integer of 2 to 100.

"j'" represents, preferably an integer of 0 to 1000, or more preferably an integer of 0 to 100.

"k" represents, in view of reactivity and stability, preferably an integer of 0 to 1000, or more preferably an integer of 0 to 100.

"k'" represents, preferably an integer of 0 to 1000, or more preferably an integer of 0 to 100.

In the above-described general formula (9), "l" represents, in view of reactivity and stability, preferably an integer of 0 to 10000, or more preferably an integer of 0 to 1000.

"m" represents, in view of reactivity and stability, preferably an integer of 2 to 1000, or more preferably an integer of 2 to 100.

"m'" represents, preferably an integer of 0 to 1000, or more preferably an integer of 0 to 100.

"p" represents, in view of reactivity and stability, preferably an integer of 2 to 1000, or more preferably an integer of 2 to 100.

"p'" represents, preferably an integer of 0 to 1000, or more preferably an integer of 0 to 100.

To be specific, when "f'" and "g'" are 0 in the above-described general formula (7), when "j'" and "k'" are 0 in the above-described general formula (8), and when "m'" and "p'" are 0 in the above-described general formula (9), preferably, examples of the organopolysiloxane containing both an alkenyl group-a hydrosilyl group include a straight chain structure of vinyl-terminated polymethylhydrosiloxane (corresponding to the above-described general formula (8)), vinyl-terminated methylhydrosiloxane-dimethylsiloxane copolymer (corresponding to the above-described general formula (8)), vinyl-terminated polyphenyl (dimethylhydroxy) siloxane (corresponding to the above-described general formula (8)), vinyl-terminated methylhydrosiloxane-phenylmethylsiloxane copolymer (corresponding to the above-described general formula (8)), vinyl-terminated methylhydrosiloxane-octylmethylsiloxane copolymer (corresponding to the above-described general formula (8)), hydrogen-terminated vinylmethylsiloxane-dimethylsiloxane copolymer (corresponding to the above-described general formula (7)), and hydrogen-terminated polyvinylmethylsiloxane (corresponding to the above-described general formula (7)).

The molecular structure of the organopolysiloxane containing both an alkenyl group-a hydrosilyl group is not limited to the above-described straight chain structure and may be, for example, a cyclic chain structure, a branched chain structure, or a three dimensional network structure.

Of the organopolysiloxanes containing both an alkenyl group-a hydrosilyl group, preferably, a vinyl-terminated methylhydrosiloxane-dimethylsiloxane copolymer (corresponding to the above-described general formula (8)) is used.

These organopolysiloxanes containing both an alkenyl group-a hydrosilyl group can be used alone (one only) or in combination of two or more.

The alkenyl group equivalent in the organopolysiloxane containing both an alkenyl group-a hydrosilyl group is, in view of toughness and flexibility of the cured product, for example, 0.005 to 10 mmol/g, or preferably 0.01 to 5 mmol/g. The alkenyl group equivalent is calculated in conformity with the calculation method (described later) of the alkenyl group equivalent of the silicone resin composition using a $^1$H-NMR.

When the alkenyl group equivalent in the organopolysiloxane containing both an alkenyl group-a hydrosilyl group is below the above-described range, the toughness of the cured product may be insufficient. When the alkenyl group equivalent exceeds the above-described range, the flexibility of the cured product may be insufficient.

The number average molecular weight of the organopolysiloxane containing both an alkenyl group-a hydrosilyl group is, for example, 1000 to 100000, or preferably 5000 to 50000.

The viscosity (at 25° C.) of the organopolysiloxane containing both an alkenyl group-a hydrosilyl group is, in view of toughness of the cured product, for example, 100 to 500000 mPa·s, or preferably 300 to 100000 mPa·s. The viscosity of the organopolysiloxane containing both an alkenyl group-a hydrosilyl group can be measured using a B-type viscometer.

The organopolysiloxane containing both an alkenyl group-a hydrosilyl group is blended in 100 parts by mass of the second material component at the mixing ratio of, for example, 0.1 to 99.9 parts by mass, preferably 1 to 99 parts by mass, more preferably 50 to 90 parts by mass, or particularly preferably 65 to 80 parts by mass.

An example of the organopolysiloxane containing no alkenyl group/containing a hydrosilyl group includes the same organopolysiloxane containing no alkenyl group/containing a hydrosilyl group as that illustrated in the first material component.

The organopolysiloxane containing no alkenyl group/containing a hydrosilyl group is blended in 100 parts by mass of the second material component at the mixing ratio of, for example, 0.1 to 99.9 parts by mass, preferably 1 to 99 parts by mass, more preferably 5 to 50 parts by mass, or particularly preferably 10 to 35 parts by mass.

The organopolysiloxane containing no alkenyl group/containing a hydrosilyl group is, in view of toughness of the cured product, blended at the mixing ratio of, for example, 0.1 to 1000 parts by mass, preferably 1 to 100 parts by mass, more preferably 10 to 65 parts by mass, or particularly preferably 20 to 45 parts by mass with respect to 100 parts by mass of the organopolysiloxane containing both an alkenyl group-a hydrosilyl group.

In the second material component, the molar ratio (the alkenyl group/the hydrosilyl group) of the alkenyl group in the organopolysiloxane containing both an alkenyl group-a hydrosilyl group to the hydrosilyl group in the organopolysiloxane containing no alkenyl group/containing a hydrosilyl group is, for example, 1/50 to 50/1, or preferably 1/5 to 5/1.

In the second material component, the molar ratio (the hydrosilyl group in the organopolysiloxane containing both an alkenyl group-a hydrosilyl group/the hydrosilyl group in the organopolysiloxane containing no alkenyl group/containing a hydrosilyl group) of the hydrosilyl group in the organopolysiloxane containing both an alkenyl group-a hydrosilyl group to the hydrosilyl group in the organopolysiloxane containing no alkenyl group/containing a hydrosilyl group is, for example, 1/30 to 30/1, or preferably 1/3 to 3/1.

The hydrosilyl group equivalent in a mixture (that is, the silicon-containing component) of the organopolysiloxane containing both an alkenyl group-a hydrosilyl group and the organopolysiloxane containing no alkenyl group/containing a hydrosilyl group is, for example, 0.3 to 3 mmol/g, or preferably 0.5 to 2 mmol/g. The hydrosilyl group equivalent is calculated in conformity with the calculation method (described later) of the alkenyl group equivalent of the silicone resin composition using a $^1$H-NMR.

When the hydrosilyl group equivalent in the mixture (that is, the silicon-containing component) of the organopolysiloxane containing both an alkenyl group-a hydrosilyl group and the organopolysiloxane containing no alkenyl group/containing a hydrosilyl group is below the above-described range, the toughness may be insufficient. When the hydrosilyl group equivalent exceeds the above-described range, the flexibility may be insufficient.

An example of the hydrosilylation catalyst includes the same addition catalyst as that illustrated in the first material component.

Of the hydrosilylation catalysts, in view of transparency of the cured product, compatibility with the second material component, and catalyst activity, preferably, a platinum catalyst is used, more preferably, a platinum olefin complex is used, or to be specific, a platinum-1,3-divinyl-1,1,3,3-tetramethyldisiloxane complex is used.

The alkenyl group in the organopolysiloxane containing both an alkenyl group-a hydrosilyl group and the hydrosilyl group in the organopolysiloxane containing no alkenyl group/containing a hydrosilyl group are subjected to a hydrosilylation reaction in the presence of the hydrosilylation catalyst. That is, the hydrosilylation catalyst improves the reaction rate of the hydrosilylation reaction of the alkenyl group with the hydrosilyl group (the SiH group).

The hydrosilylation catalyst may be prepared as a solution in a known solvent (such as toluene).

The hydrosilylation catalyst is blended in the second material component at the mixing ratio of, for example, $1.0 \times 10^{-4}$ to 0.5 parts by mass, or preferably $1.0 \times 10^{-3}$ to 0.5 parts by mass with respect to 100 parts by mass of the organopolysiloxane containing both an alkenyl group-a hydrosilyl group.

The hydrosilylation catalyst is blended in the second material component at the mixing ratio of, for example, $1.0 \times 10^{-6}$ to $5.0 \times 10^{-3}$ mmol, or preferably $1.0 \times 10^{-5}$ to $5.0 \times 10^{-3}$ mmol with respect to 1 mol of the alkenyl group in the organopolysiloxane containing both an alkenyl group-a hydrosilyl group in the second material component.

An example of the hydrosilylation retarder includes a quaternary ammonium hydroxide such as a tetraalkyl ammonium hydroxide including a tetramethyl ammonium hydroxide, a tetraethyl ammonium hydroxide, a tetrapropyl ammonium hydroxide, a tetrahexyl ammonium hydroxide, and a tetrabutyl ammonium hydroxide and a trialkyl ammonium hydroxide such as a hexadecyltrimethyl ammonium hydroxide and a benzyltrimethyl ammonium hydroxide.

These hydrosilylation retarders can be used alone (one only) or in combination of two or more.

Of the hydrosilylation retarders, preferably, a tetraalkyl ammonium hydroxide is used, more preferably, a tetraalkyl ammonium hydroxide containing an alkyl group having 1 to 4 carbon atoms is used, or particularly preferably, a tetramethyl ammonium hydroxide is used.

The hydrosilylation retarder is, in view of catalyst activity and easy availability, for example, used as an aqueous solution or an alcohol solution and is, in view of transparency and handling ability of the cured product, preferably, used as a methanol solution.

The hydrosilylation retarder stabilizes the hydrosilylation catalyst and suppresses the hydrosilylation reaction of the alkenyl group with the hydrosilyl group. The hydrosilylation retarder also accelerates a condensation reaction of a silanol group produced by allowing the hydrosilyl group to react with water.

The hydrosilylation retarder is blended in the second material component at the mixing ratio of, for example, $1.0 \times 10^2$ to $1.0 \times 10^6$ parts by mass, or preferably $1.0 \times 10^3$ to $1.0 \times 10^5$ parts by mass with respect to 100 parts by mass of the hydrosilylation catalyst.

When the mixing proportion of the hydrosilylation retarder is below the above-described range, a sufficient suppressing effect on curing may not be obtained. When the mixing proportion of the hydrosilylation retarder exceeds the above-described range, there may be a case where it becomes difficult to cure the second material component or the heat resistance of the cured product is reduced.

To prepare the second material component, the organopolysiloxane containing both an alkenyl group-a hydrosilyl group, the organopolysiloxane containing no alkenyl group/containing a hydrosilyl group, the hydrosilylation catalyst, and the hydrosilylation retarder are blended at the above-described mixing proportion to be stirred and mixed at, for example, 0 to 60° C., for, for example, 1 to 120 minutes.

In the second material component, it is possible to suppress the hydrosilylation reaction of the alkenyl group in the organopolysiloxane containing both an alkenyl group-a hydrosilyl group with the hydrosilyl group in the organopolysiloxane containing no alkenyl group/containing a hydrosilyl group with the hydrosilylation retarder and to progress the condensation reaction of the hydrosilyl group in the organopolysiloxane containing both an alkenyl group-a hydrosilyl group with the hydrosilyl group in the organopolysiloxane containing no alkenyl group/containing a hydrosilyl group by heating as required.

As a result, the second material component can be uniformly semi-cured.

In the second material component, the hydrosilylation retarder can accelerate the silanol condensation reaction of the silanol group produced by allowing the hydrosilyl group to react with water by heating as required, while stabilizing the hydrosilylation catalyst and suppressing the hydrosilylation reaction of the alkenyl group with the hydrosilyl group.

As a result, the second material component can be semi-cured, while the hydrosilylation reaction of the alkenyl group with the hydrosilyl group can be suppressed.

The silicone resin composition of the present invention is prepared from the material components (the first material component and the second material component).

In the silicone resin composition, the alkenyl group equivalent (that is, the number of moles of alkenyl group per 1 g of the silicon-containing component or the content of the alkenyl group) in the silicon-containing component is 200 to 2000 µmol/g.

The alkenyl group equivalent in the silicon-containing component is measured after the preparation of the material components and before the progress of the hydrosilylation reaction.

To be specific, in the first material component, the alkenyl group equivalent in the silicone resin composition, which is after blending the silicon compound containing both an alkenyl group-a silanol condensation reactive functional group, the polysiloxane containing silanol groups at both ends, the silicon compound containing both an epoxy group-a silanol condensation reactive functional group, the organopolysiloxane containing no alkenyl group/containing a hydrosilyl group, the condensation catalyst, and the addition catalyst and before being subjected to the hydrosilylation reaction (before being brought into a C-stage state), is measured.

In the second material component, the alkenyl group equivalent in the silicone resin composition, which is after blending the organopolysiloxane containing both an alkenyl group-a hydrosilyl group, the organopolysiloxane containing no alkenyl group/containing a hydrosilyl group, the hydrosilylation catalyst, and the hydrosilylation retarder and before being subjected to the hydrosilylation reaction, is measured.

In the silicone resin composition, the alkenyl group equivalent in the silicon-containing component is within a specific range, so that the silicone resin composition has an excellent heat resistance.

On the other hand, when the alkenyl group equivalent in the silicon-containing component is below the above-described range, the cross-linking density (the number of cross-linking points) of the alkenyl group-bonded silicon-containing compound and/or the compound containing both hydrocarbon group-bonded/alkenyl group-bonded silicons (when the material component is the first material component, the silicon compound containing both an alkenyl group-a silanol condensation reactive functional group and when the material component is the second material component, the organopolysiloxane containing both an alkenyl group-a hydrosilyl group) is reduced, so that the encapsulating layer formed from the silicone resin composition is subjected to a bleeding.

On the other hand, when the alkenyl group equivalent in the silicon-containing component exceeds the above-described range, the distance between the cross-linking points shortens and the hardness of the cured product becomes excessively high, so that the encapsulating layer becomes fragile.

To be specific, the alkenyl group equivalent is measured in the following manner.

First, the silicone resin composition is dissolved in a solvent. Next, by a $^1$H-NMR measurement, an integral value A of the peak intensity of the hydrogen atom in the alkenyl group bonded to the silicon atom and an integral value B of the peak intensity of the hydrogen atom in the monovalent hydrocarbon group bonded to the silicon atom are obtained.

Next, the obtained integral value A of the peak intensity is divided by the number of hydrogen atoms Y contained in the alkenyl group, so that an integral value A/Y of the peak intensity per one molecule of the alkenyl group is obtained. Next, A/Y is multiplied by the molecular weight of a portion containing an alkenyl group-a silicon atom, which contains an alkenyl group and a silicon atom, shown in the following general formula (10), so that parts by mass A' of the silicon atom to which the alkenyl group is bonded is obtained.

A Portion Containing an Alkenyl Group-a Silicon Atom

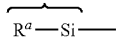

(10)

(where, in general formula (10), $R^a$ represents an alkenyl group.)

Next, the obtained integral value B of the peak intensity is divided by the number of hydrogen atoms Z contained in the monovalent hydrocarbon group, so that an integral value B/Z of the peak intensity per one molecule of the monovalent hydrocarbon group is obtained. Next, B/Z is multiplied by the molecular weight of a main chain portion, which contains a monovalent hydrocarbon group and a siloxane portion, shown in the following general formula (11), so that parts by mass B' of the main chain portion is obtained.

A Main Chain Portion

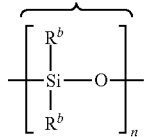

(11)

(where, in general formula (11), $R^b$ represents a monovalent hydrocarbon group and "n" represents an integer of 1 or more.)

Since the above-described parts by mass B' of the main chain portion is approximated as the average molecular weight of the silicon-containing component, B'/A' (g/mol) serves as the number of grams of the silicon-containing component with respect to 1 mol of the alkenyl group and the reciprocal thereof, that is, A'/B' (mol/g) is calculated as the number of moles of alkenyl group per 1 g of the silicon-containing component, that is, the alkenyl group equivalent (the content of the alkenyl group).

The alkenyl group equivalent in the silicon-containing component is, preferably 225 to 1000 µmol/g, or more preferably 250 to 800 µmol/g.

To be specific, when the material component is the first material component, the alkenyl group equivalent in the silicon containing component is, for example, 300 to 2000 µmol/g, preferably 350 to 1000 µmol/g, or more preferably 400 to 800 µmol/g.

When the material component is the second material component, the alkenyl group equivalent in the silicon-containing component is, for example, 200 to 1500 µmol/g, preferably 225 to 1000 µmol/g, or more preferably 250 to 900 µmol/g.

An additive can be added to the material component at an appropriate proportion to be prepared as long as it does not damage the effect of the present invention. Examples of the additive include fillers, furthermore, antioxidants, modifiers, surfactants, dyes, pigments, discoloration inhibitors, ultraviolet absorbers, anti-crepe hardening agents, plasticizers, thixotrophy imparting agents, and fungicides.

An example of the filler includes an inorganic filler such as silica, titanium oxide, zirconium oxide, magnesium oxide, zinc oxide, iron oxide, aluminum hydroxide, calcium carbonate, layered mica, carbon black, diatomite, a glass fiber, and a phosphor.

The silicone resin composition can be used as an encapsulating material having an excellent heat resistance.

That is, as described above, the encapsulating material can be first semi-cured (in a B-stage state) by the condensation reaction and then, be completely cured (in a C-stage state) by the addition reaction. Therefore, when the encapsulating material is formed into a sheet shape in a semi-cured state, a light emitting diode device (describe later) can be produced with high production efficiency, while the handling ability thereof can be improved.

Next, one embodiment of the light emitting diode device of the present invention using an encapsulating sheet formed from the encapsulating material is described with reference to FIGS. 1 to 3.

As shown in FIG. 1, an encapsulating sheet 1 includes an encapsulating layer 7 and a phosphor layer 5 laminated on the encapsulating layer 7.

The encapsulating layer 7 is formed from the above-described silicone resin composition and is formed into a sheet shape.

The encapsulating layer 7 may be formed of a single layer or a plurality of layers.

The thickness of the encapsulating layer 7 is, for example, 200 to 800 µm, preferably 300 to 700 µm, or more preferably 400 to 600 µm.

The phosphor layer 5 is laminated on one surface in the thickness direction of the encapsulating layer 7 and is formed from a phosphor-containing resin composition into a sheet shape.

The phosphor-containing resin composition contains a phosphor and a resin composition.

The phosphor is not particularly limited as long as it has a wavelength conversion function and is a known phosphor used in a light emitting diode device. An example thereof includes a known phosphor such as a yellow phosphor capable of converting blue light into yellow light and a red phosphor capable of converting the blue light into red light.

Examples of the yellow phosphor include a garnet type phosphor such as $Y_3Al_5O_{12}$:Ce (YAG (yttrium aluminum garnet):Ce) and $Tb_3Al_3O_{12}$:Ce (TAG (terbium aluminum garnet):Ce) and an oxynitride phosphor such as Ca-α-SiAlON.

An example of the red phosphor includes a nitride phosphor such as $CaAlSiN_3$:Eu and $CaSiN_2$:Eu.

Of the phosphors, preferably, a yellow phosphor is used, or more preferably, YAG:Ce is used.

These phosphors can be used alone or in combination.

The phosphor is in the form of a particle and the shape thereof is not particularly limited. Examples of the shape thereof include a generally sphere shape, a generally flat plate shape, and a generally needle shape.

The average particle size (the average of the maximum length) of the phosphor is, for example, 0.1 to 500 μm, or preferably 0.2 to 200 μm. The average particle size of the phosphor particle is measured with a particle size distribution analyzer.

The resin composition includes, for example, a known transparent resin used in the light emitting diode device. Examples of the transparent resin include a thermosetting resin such as a silicone resin, an epoxy resin, and a urethane resin and a thermoplastic resin such as an acrylic resin, a styrene resin, a polycarbonate resin, and a polyolefin resin.

These transparent resins can be used alone or in combination.

Of the transparent resins, preferably, a thermosetting resin is used, or more preferably, in view of durability, heat resistance, and light resistance, a silicone resin is used.

Of the transparent resin compositions, preferably, a resin composition containing a silicone resin (a silicone resin composition) is used.

An example of the silicone resin composition includes a condensation/addition reaction curable type silicone resin composition which includes the silicone resin composition in the present invention.

To prepare the phosphor-containing resin composition, the above-described phosphor and resin composition are blended to be stirred and mixed.

The mixing ratio of the phosphor is appropriately selected according to the type of the phosphor, the thickness of the phosphor layer 5, the shape of the encapsulating sheet 1, or the like. The mixing ratio of the phosphor is, for example, 1 to 50 mass %, or preferably 10 to 40 mass % with respect to the phosphor-containing resin composition.

The stirring temperature is, for example, room temperature (about 25° C.) to 50° C. and the stirring duration is, for example, 1 minute to 180 minutes.

The thickness of the phosphor layer 5 is not particularly limited and is, for example, 20 to 300 μm, preferably 30 to 200 μm, or more preferably 70 to 120 μm.

The phosphor layer 5 can be formed of a ceramic of the phosphor (a phosphor ceramic) by sintering the phosphor as a ceramic material.

Next, a method for producing the encapsulating sheet 1 is described with reference to FIG. 2.

Figure 2:
FIG. 2 shows process drawings for illustrating the steps for producing the encapsulating sheet shown in FIG. 1:
(a) illustrating a step of preparing a release sheet,
(b) illustrating a step of forming a phosphor layer, and
(c) illustrating a step of laminating an encapsulating resin layer.
Figure 2:
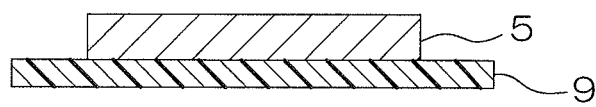
Figure 2:
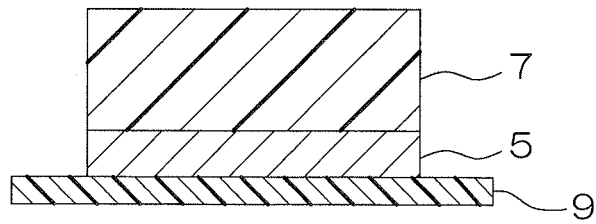

In this method, as shown in FIG. 2 (a), first, a release sheet 9 is prepared.

The release sheet 9 is a protecting sheet which covers and protects the top surface (the phosphor layer 5) of the encapsulating sheet 1 and a coating substrate of the encapsulating sheet 1. Examples thereof include a polyester film such as a polyethylene terephthalate (PET) film; a polycarbonate film; a polyolefin film such as a polyethylene film and a polypropylene film; a polystyrene film; an acrylic resin film; and a resin film such as a silicone resin film and a fluorine resin film.

Of the release sheets 9, preferably, a polyester film is used.

A release treatment is performed on the top surface (the surface on the side where the phosphor layer 5 is to be formed) of the release sheet 9 as required so as to increase the release characteristics from the phosphor layer 5.

The thickness of the release sheet 9 is not particularly limited and is, in view of handling ability and cost, for example, 20 to 100 μm, or preferably 30 to 80 μm.

Next, as shown in FIG. 2 (b), the phosphor layer 5 is laminated on the release sheet 9.

A method for laminating the phosphor layer 5 on the release sheet 9 is not particularly limited. Examples of the method include a method for forming the phosphor layer 5 directly on the release sheet 9 and a method for attaching (transferring) the phosphor layer 5 to the release sheet 9 after forming the phosphor layer 5 on another film.

Of the laminating methods, preferably, a method for forming the phosphor layer 5 directly on the release sheet 9 is used. To be specific, a method for forming the phosphor layer 5 in which the phosphor-containing resin composition is applied directly on the release sheet 9 to obtain a phosphor film and the obtained phosphor film is cured by heating is used.

Curing conditions are as follows: a heating temperature of, for example, 80 to 150° C., or preferably 90 to 150° C. and a heating duration of, for example, 1 to 100 minutes, or preferably 5 to 15 minutes.

Next, as shown in FIG. 2 (c), the encapsulating layer 7 is laminated on the phosphor layer 5.

To be specific, the encapsulating layer 7 is laminated on the entire upper surface (one surface at the opposite side of the other surface where the phosphor layer 5 is in contact with the release sheet 9) of the phosphor layer 5.

To laminate the encapsulating layer 7 on the phosphor layer 5, for example, the silicone resin composition in which the condensation reaction is not yet completed is applied onto the entire upper surface of the phosphor layer 5 by a known application method such as a casing, a spin coating, and a roll coating to form an encapsulating film.

Thereafter, the encapsulating film is heated to semi-cure the silicone resin composition.

To be specific, the silicone resin composition is brought into a B-stage state (in a semi-cured state) by the condensation reaction by heating.

For example, when the silicone resin composition is prepared from the first material component, the silanol condensation reaction of the silanol group in the polysiloxane containing silanol groups at both ends, the hydrosilyl group in the silicon compound containing both an alkenyl group-a silanol condensation reactive functional group, and the hydrosilyl group in the silicon compound containing both an epoxy group-a silanol condensation reactive functional group is progressed.

When the silicone resin composition is prepared from the second material component, the silanol condensation reaction of the hydrosilyl group in the organopolysiloxane containing both an alkenyl group-a hydrosilyl group and the hydrosilyl group in the organopolysiloxane containing no alkenyl group/containing a hydrosilyl group is progressed.

Heating conditions are as follows: a temperature of, for example, 50 to 150° C., or preferably 80 to 120° C. and a heating duration of, for example, 1 to 100 minutes, or preferably 5 to 15 minutes.

In this way, the encapsulating layer 7 in a sheet shape is laminated on the upper surface of the phosphor layer 5.

As described above, the encapsulating sheet 1 is fabricated.

Next, a method for producing a light emitting diode device 2 by encapsulating a light emitting diode element 11 using the encapsulating sheet 1 is described with reference to FIG. 3.

Figure 3:
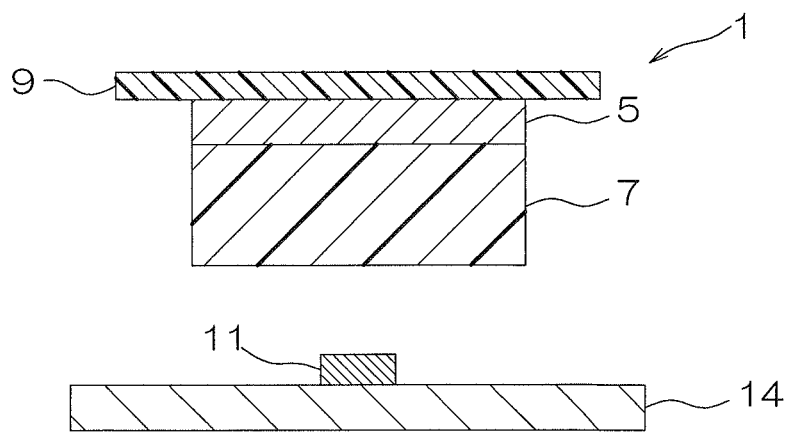
FIG. 3 shows process drawings for illustrating the steps for fabricating a light emitting diode device by encapsulating a light emitting diode element by the encapsulating sheet shown in FIG. 2:
(a) illustrating a step of preparing the encapsulating sheet and the light emitting diode element,
(b) illustrating a step of heating the encapsulating sheet to be cured, and
(c) illustrating a step of peeling off a release sheet from the light emitting diode device.
Figure 3:
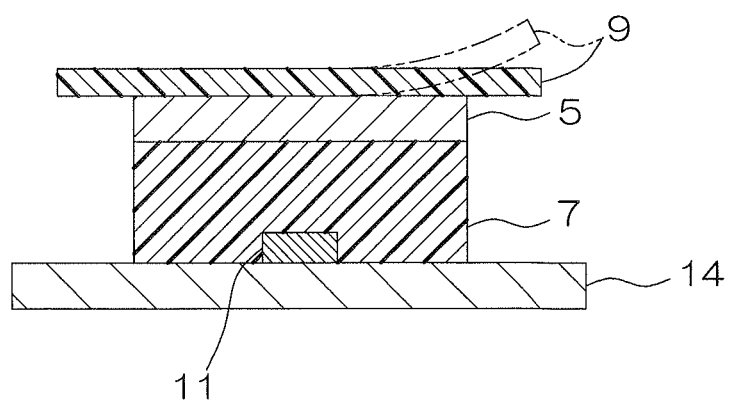
Figure 3:
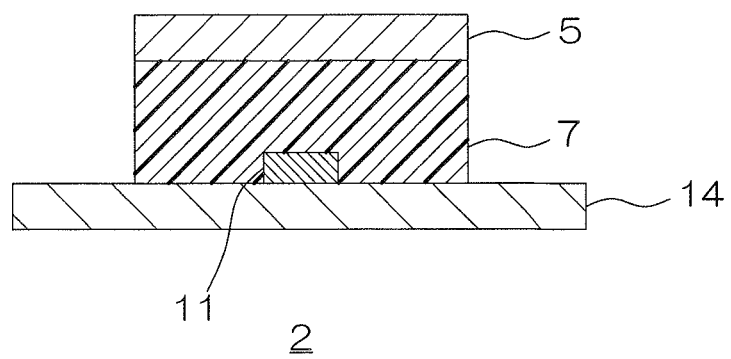

In this method, as shown in FIG. 3 (a), first, the encapsulating sheet 1 and a board 14 are prepared.

The encapsulating sheet 1 is prepared by reversing the encapsulating sheet 1 shown in FIG. 2 (c) upside down.

The board 14 is formed into a generally flat plate shape which is larger than the encapsulating sheet 1.

On the board 14, the light emitting diode element 11 is mounted in the central portion thereof by a known connecting method such as a wire bonding or a flip-chip mounting. A plurality of the light emitting diode elements 11 can be mounted on the board 14 as required.

The light emitting diode element 11 is, for example, a light emitting diode element capable of emitting blue light and is formed into a generally rectangular shape in sectional view.

As shown in FIG. 3 (a), the encapsulating sheet 1 is disposed at the upper side of the prepared board 14.

To be specific, the encapsulating layer 7 of the encapsulating sheet 1 and the light emitting diode element 11 mounted on the board 14 are disposed so as to be opposed to each other in the up-down direction.

Next, as shown in FIG. 3 (b), the encapsulating sheet 1 is attached to the board 14 to encapsulate the light emitting diode element 11.

To be specific, the encapsulating sheet 1 is flat plate pressed under predetermined conditions, so that the light emitting diode element 11 is covered by the encapsulating sheet 1 and the encapsulating sheet 1 is adhered to the light emitting diode element 11 and the board 14.

Pressing conditions are as follows: a temperature of, for example, 80 to 220° C., or preferably 100 to 200° C. and a pressure of, for example, 0.01 to 1 MPa, or preferably 0.01 to 0.5 MPa.

At this time, the light emitting diode element 11 is housed in the encapsulating layer 7.

Next, the encapsulating layer 7 of the encapsulating sheet 1 is cured under predetermined conditions.

To be specific, the addition reaction is progressed by heating the encapsulating layer 7 of the encapsulating sheet 1, so that the encapsulating layer 7 of the encapsulating sheet 1 is brought into a C-stage state (completely cured).

To be specific, when the silicone resin composition is prepared from the first material component, the hydrosilylation reaction of the alkenyl group in the silicon compound containing both an alkenyl group-a silanol condensation reactive functional group with the hydrosilyl group in the organopolysiloxane containing no alkenyl group/containing a hydrosilyl group is progressed. When the silicone resin composition is prepared from the second material component, the hydrosilylation reaction of the alkenyl group in the organopolysiloxane containing both an alkenyl group-a hydrosilyl group with the hydrosilyl group in the organopolysiloxane containing no alkenyl group/containing a hydrosilyl group is progressed.

The curing conditions are the conditions in which the above-described encapsulating layer 7 is completely cured, that is, the conditions in which the hydrosilylation reaction (the addition reaction) in the silicone resin composition is progressed.

To be specific, the heating temperature is, for example, 80 to 200° C., or preferably 100 to 180° C. and the heating duration is, for example, 1 to 30 minutes, or preferably 1 to 10 minutes.

Next, as shown in phantom lines in FIG. 3 (b), the release sheet 9 is peeled off As described above, as shown in FIG. 3 (c), the light emitting diode device 2 in which the light emitting diode element 11 is encapsulated by the encapsulating layer 7 is fabricated.

That is, the light emitting diode device 2 including the light emitting diode element 11 and the encapsulating layer 7 that encapsulates the light emitting diode element 11 is fabricated.

In the light emitting diode device 2, before peeling off the release sheet 9, the encapsulating sheet 1 is pressure molded by flat plate pressing to be adhered to the light emitting diode element 11 and the board 14. However, the method for allowing the encapsulating sheet 1 to be adhered to the light emitting diode element 11 and the board 14 is not limited to this. For example, after peeling off the release sheet 9, the encapsulating sheet 1 is pressure molded by flat plate pressing or a metal mold die to be adhered to the light emitting diode element 11 and the board 14. Thereafter, the release sheet 9 can be peeled off.

In the silicone resin composition of the present invention, the alkenyl group equivalent is within a specific range. As a result, the encapsulating material of the present invention made of the silicone resin composition having an excellent heat resistance has an excellent heat resistance.

Therefore, the encapsulating layer 7 formed from the encapsulating material has an excellent heat resistance, so that even when the light emitting diode element 11 generates heat along with the light emission thereof, a bleeding in the encapsulating layer 7 can be suppressed. As a result, the light emitting diode device 2 has an excellent appearance.

EXAMPLES

While the present invention will be described hereinafter in further detail with reference to Examples and Comparative Examples, the present invention is not limited to these Examples and Comparative Examples.

Example 1

100 g of a polydimethylsiloxane containing silanol groups at both ends (a polysiloxane containing silanol groups at both ends, a number average molecular weight of 1500, a silanol group equivalent of 1.33 mmol/g), 5.93 g (40.0 mmol) of a vinyltrimethoxysilane (a silicon compound containing both an alkenyl group-a silanol condensation reactive functional group, a vinyl group equivalent of 6.75 mmol/g), and 1.05 g (4.4 mmol) of a (3-glycidoxypropyl)trimethoxysilane (a silicon compound containing both an epoxy group-a silanol condensation reactive functional group, an epoxy group equivalent of 4.2 mmol/g) were blended to be stirred and mixed, so that a mixture was prepared.

The proportion (=the silanol group/the methoxy group) of the total number of the methoxy group in the vinyltrimethoxysilane and the methoxy group in the (3-glycidoxypropyl) trimethoxysilane to the silanol group in the polydimethylsiloxane containing silanol groups at both ends in the mixture was 1/1 in molar ratio.

Thereafter, 366 μL (0.5 mol with respect to 100 mol of the polydimethylsiloxane containing silanol groups at both ends) of a methanol solution with a concentration of 10 mass % tetramethylammonium hydroxide (a condensation catalyst) was blended in the mixture and the obtained mixture was stirred at room temperature (at 25° C.) for 1 hour. In this way, the mixture was reacted. Next, the pressure of a reaction solution was reduced at 25° C. for 1 hour and volatile components (methanol or the like) were distilled off.

Thereafter, 16.81 g of a dimethylpolysiloxane-co-methylhydrogenpolysiloxane (an organopolysiloxane containing a hydrogen atom in its side chain, in general formula (3), all of $R^3$s are methyl groups, "a"=10, "b"=10, "b'"=0; a number average molecular weight of 2000, a viscosity of 20 mPa√s (at 25° C.), a hydrosilyl group equivalent of 7.14 mmol/g) was blended in the obtained reaction liquid to be stirred at 25° C. for 1 hour and then, 15 µL of a platinum-1,3-divinyl-1,1,3,3-tetramethyldisiloxane complex (a platinum concentration of 2 mass %: an addition catalyst) was blended therein to be mixed.

The proportion (the vinyl group/the hydrosilyl group) of the vinyl group in the vinyltrimethoxysilane to the hydrosilyl group in the dimethylpolysiloxane-co-methylhydrogenpolysiloxane was 1/3 in molar ratio.

In this way, a silicone resin composition was obtained.

Example 2

30 g of a vinyl-terminated methylhydrosiloxane-dimethylsiloxane copolymer (an organopolysiloxane containing both an alkenyl group-a hydrosilyl group, corresponding to the above-described general formula (8), a vinyl group equivalent of 0.84 mmol/g) and 14.3 µL (an amount of tetramethylammonium hydroxide: 0.013 mmol) of a methanol solution with a concentration of 10 mass % tetramethylammonium hydroxide (a hydrosilylation retarder) were blended and thereafter, 10.6 g of a dimethylpolysiloxane-co-methylhydrogenpolysiloxane (an organopolysiloxane containing no alkenyl group/containing a hydrosilyl group, in general formula (3), all of $R^3$s are methyl groups, "a"=10, "b"=10, "b'"=0; a number average molecular weight of 2000, a viscosity of 20 mPa·s (at 25° C.), a hydrosilyl group equivalent of 7.14 mmol/g) was blended therein to prepare a mixture. The hydrosilyl group equivalent in the mixture was 1.87 mmol/g.

The proportion (the vinyl group/the hydrosilyl group) of the vinyl group in the vinyl-terminated methylhydrosiloxane-dimethylsiloxane copolymer to the hydrosilyl group in the dimethylpolysiloxane-co-methylhydrogenpolysiloxane was 1/3 in molar ratio. The proportion (the hydrosilyl group/the hydrosilyl group) of the hydrosilyl group in the vinyl-terminated methylhydrosiloxane-dimethylsiloxane copolymer to the hydrosilyl group in the dimethylpolysiloxane-co-methylhydrogenpolysiloxane was 1/1 in molar ratio.

Thereafter, 1.9 µL of a platinum-1,3-divinyl-1,1,3,3-tetramethyldisiloxane complex (a platinum concentration of 2 mass %: a hydrosilylation catalyst) was blended therein to be mixed.

In this way, a silicone resin composition was obtained.

Example 3

30 g of a vinyl-terminated methylhydrosiloxane-dimethylsiloxane copolymer (an organopolysiloxane containing both an alkenyl group-a hydrosilyl group, corresponding to the above-described general formula (8), a vinyl group equivalent of 0.3 mmol/g) and 14.3 µL (an amount of tetramethylammonium hydroxide: 0.013 mmol) of a methanol solution with a concentration of 10 mass % tetramethylammonium hydroxide (a hydrosilylation retarder) were blended and thereafter, 3.8 g of an organopolysiloxane containing no alkenyl group/containing a hydrosilyl group (in general formula (3), all of $R^3$s are methyl groups, "a"=10, "b"=10, "b'"=0; a number average molecular weight of 2000, a viscosity of 20 mPa·s (at 25° C.), a hydrosilyl group equivalent of 7.14 mmol/g) was blended therein to prepare a mixture. The hydrosilyl group equivalent in the mixture was 0.80 mmol/g.

The proportion (the vinyl group/the hydrosilyl group) of the vinyl group in the vinyl-terminated methylhydrosiloxane-dimethylsiloxane copolymer to the hydrosilyl group in the dimethylpolysiloxane-co-methylhydrogenpolysiloxane was 1/3 in molar ratio. The proportion (the hydrosilyl group/the hydrosilyl group) of the hydrosilyl group in the vinyl-terminated methylhydrosiloxane-dimethylsiloxane copolymer to the hydrosilyl group in the dimethylpolysiloxane-co-methylhydrogenpolysiloxane was 1/1 in molar ratio.

Thereafter, 1.9 µL of a platinum-1,3-divinyl-1,1,3,3-tetramethyldisiloxane complex (a platinum concentration of 2 mass %: a hydrosilylation catalyst) was blended therein to be mixed.

In this way, a silicone resin composition was obtained.

Comparative Example 1 (in Conformity with Example 1 in Japanese Unexamined Patent Publication No. 2010-265436)

100 g of a dimethylpolysiloxane containing silanol groups at both ends (a polysiloxane containing silanol groups at both ends, a number average molecular weight of 11500, a silanol group equivalent of 0.17 mmol/g), 0.773 g (5.22 mmol) of a vinyltrimethoxysilane (a silicon compound containing both an alkenyl group-a silanol condensation reactive functional group, a vinyl group equivalent of 6.75 mmol/g), and 0.137 g (0.58 mmol) of a (3-glycidoxypropyl)trimethoxysilane (a silicon compound containing both an epoxy group-a silanol condensation reactive functional group, an epoxy group equivalent of 4.23 mmol/g) were blended to be stirred and mixed, so that a mixture was prepared.

The proportion (=the silanol group/the methoxy group) of the total number of the methoxy group in the vinyltrimethoxysilane and the methoxy group in the (3-glycidoxypropyl)trimethoxysilane to the silanol group in the dimethylpolylsiloxane containing silanol groups at both ends in the mixture was 1/1 in molar ratio.

Thereafter, 48 µL (0.5 mol with respect to 100 mol of the dimethylpolysiloxane containing silanol groups at both ends) of a methanol solution with a concentration of 10 mass % tetramethylammonium hydroxide (a condensation catalyst) was blended in the mixture and the obtained mixture was stirred at 40° C. for 1 hour. In this way, the mixture was reacted. Next, the pressure of a reaction solution was reduced at 40° C. for 1 hour and volatile components (methanol or the like) were distilled off.

Thereafter, 2.19 g of a dimethylpolysiloxane-co-methylhydrogenpolysiloxane (an organopolysiloxane containing a hydrogen atom in its side chain, in general formula (3), all of $R^3$s are methyl groups, "a"=10, "b"=10, "b'"=0; a number average molecular weight of 2000, a viscosity of 20 mPa·s (at 25° C.), a hydrosilyl group equivalent of 7.14 mmol/g) was blended in the obtained reaction liquid to be stirred at 40° C. for 1 hour and then, 1.25 µL of a platinum-1,3-divinyl-1,1,3,3-tetramethyldisiloxane complex (a platinum concentration of 2 mass %: an addition catalyst) was blended therein to be mixed.

The proportion (the vinyl group/the hydrosilyl group) of the vinyl group in the vinyltrimethoxysilane to the hydrosilyl group in the dimethylpolysiloxane-co-methylhydrogenpolysiloxane was 1/3 in molar ratio.

In this way, a silicone resin composition was obtained.

Comparative Example 2

100 g of a polydimethylsiloxane containing silanol groups at both ends (a polysiloxane containing silanol groups at both ends, a number average molecular weight of 3000, a silanol group equivalent of 0.66 mmol/g), 2.96 g (20.0 mmol) of a vinyltrimethoxysilane (a silicon compound containing both an alkenyl group-a silanol condensation reactive functional group, a vinyl group equivalent of 6.75 mmol/g), and 0.53 g (0.22 mmol) of a (3-glycidoxypropyl)trimethoxysilane (a silicon compound containing both an epoxy group-a silanol condensation reactive functional group, an epoxy group equivalent of 0.42 mmol/g) were blended to be stirred and mixed, so that a mixture was prepared.

The proportion (=the silanol group/the methoxy group) of the total number of the methoxy group in the vinyltrimethoxysilane and the methoxy group in the (3-glycidoxypropyl)trimethoxysilane to the silanol group in the polydimethylsiloxane containing silanol groups at both ends in the mixture was 1/1 in molar ratio.

Thereafter, 183 μL (0.5 mol with respect to 100 mol of the polydimethylsiloxane containing silanol groups at both ends) of a methanol solution with a concentration of 10 mass % tetramethylammonium hydroxide (a condensation catalyst) was blended therein to be stirred at 25° C. for 1 hour. In this way, the mixture was reacted. Next, the pressure of a reaction solution was reduced at 25° C. for 1 hour and volatile components (methanol or the like) were distilled off.

Thereafter, 8.40 g of a dimethylpolysiloxane-co-methylhydrogenpolysiloxane (an organopolysiloxane containing a hydrogen atom in its side chain, in general formula (3), all of R3s are methyl groups, "a"=10,"b'"=10,"b'"=0; a number average molecular weight of 2000, a viscosity of 20 mPa·s (at 25° C.), a hydrosilyl group equivalent of 7.14 mmol/g) was blended in the obtained reaction liquid to be stirred at 25° C. for 1 hour and then, 4.8 μL of a platinum-1,3-divinyl-1,1,3,3-tetramethyldisiloxane complex (a platinum concentration of 2 mass %: an addition catalyst) was blended therein to be mixed.

The proportion (the vinyl group/the hydrosilyl group) of the vinyl group in the vinyltrimethoxysilane to the hydrosilyl group in the dimethylpolysiloxane-co-methylhydrogenpolysiloxane was 1/3 in molar ratio.

In this way, a silicone resin composition was obtained.

Comparative Example 3

30 g of a vinyl-terminated methylhydrosiloxane-dimethylsiloxane copolymer (an organopolysiloxane containing both an alkenyl group-a hydrosilyl group, corresponding to the above-described general formula (8), a vinyl group equivalent of 0.079 mmol/g) and 14.3 μL (an amount of tetramethylammonium hydroxide: 0.013 mmol) of a methanol solution with a concentration of 10 mass % tetramethylammonium hydroxide (a hydrosilylation retarder) were blended and thereafter, 1.00 g of a dimethylpolysiloxane-co-methylhydrogenpolysiloxane (an organopolysiloxane containing no alkenyl group/containing a hydrosilyl group, in general formula (3), all of $R^3$s are methyl groups, "a"=10,"b"=10, "b'"=0; a number average molecular weight of 2000, a viscosity of 20 mPa·s (at 25° C.), a hydrosilyl group equivalent of 7.14 mmol/g) was blended therein. The hydrosilyl group equivalent in the mixture was 0.23 mmol/g.

The proportion (the vinyl group/the hydrosilyl group) of the vinyl group in the vinyl-terminated methylhydrosiloxane-dimethylsiloxane copolymer to the hydrosilyl group in the dimethylpolysiloxane-co-methylhydrogenpolysiloxane was 1/3 in molar ratio. The proportion (the hydrosilyl group/the hydrosilyl group) of the hydrosilyl group in the vinyl-terminated methylhydrosiloxane-dimethylsiloxane copolymer to the hydrosilyl group in the dimethylpolysiloxane-co-methylhydrogenpolysiloxane was 1/1 in molar ratio.

Thereafter, 1.9 μL of a platinum-1,3-divinyl-1,1,3,3-tetramethyldisiloxane complex (a platinum concentration of 2 mass %: a hydrosilylation catalyst) was blended therein to be mixed.

In this way, a silicone resin composition was obtained.

Comparative Example 4

30 g of a vinyl-terminated methylhydrosiloxane-dimethylsiloxane copolymer (an organopolysiloxane containing both an alkenyl group-a hydrosilyl group, corresponding to the above-described general formula (8), a vinyl group equivalent of 0.13 mmol/g) and 14.3 μL (an amount of tetramethylammonium hydroxide: 0.013 mmol) of a methanol solution with a concentration of 10 mass % tetramethylammonium hydroxide (a hydrosilylation retarder) were blended and thereafter, 1.63 g of a dimethylpolysiloxane-co-methylhydrogenpolysiloxane (an organopolysiloxane containing no alkenyl group/containing a hydrosilyl group, in general formula (3), all of $R^3$s are methyl groups, "a"=10,"b"=10, "b'"=0; a number average molecular weight of 2000, a viscosity of 20 mPa·s (at 25° C.), a hydrosilyl group equivalent of 7.14 mmol/g) was blended therein. The hydrosilyl group equivalent in the mixture was 0.37 mmol/g.

The proportion (the vinyl group/the hydrosilyl group) of the vinyl group in the vinyl-terminated methylhydrosiloxane-dimethylsiloxane copolymer to the hydrosilyl group in the dimethylpolysiloxane-co-methylhydrogenpolysiloxane was 1/3 in molar ratio. The proportion (the hydrosilyl group/the hydrosilyl group) of the hydrosilyl group in the vinyl-terminated methylhydrosiloxane-dimethylsiloxane copolymer to the hydrosilyl group in the dimethylpolysiloxane-co-methylhydrogenpolysiloxane was 1/1 in molar ratio.

Thereafter, 1.9 μL of a platinum-1,3-divinyl-1,1,3,3-tetramethyldisiloxane complex (a platinum concentration of 2 mass %: a hydrosilylation catalyst) was blended therein to be mixed.

In this way, a silicone resin composition was obtained.

(Evaluation)

1. Measurement of Vinyl Group Equivalent (Number of Moles of Vinyl Group Per 1 g of Silicon-Containing Component)

Each of the silicone resin compositions obtained in Examples and Comparative Examples was dissolved in deuterated benzene to prepare a sample and the sample was measured by a $^1$H-NMR.

To be specific, an integral value A of the peak intensity of a hydrogen atom (5.7 to 6.4 (ppm)) in a vinyl group and an integral value B of the peak intensity of a hydrogen atom (1.8 to 2.0 (ppm)) in a methyl group were obtained.

The obtained integral value A of the peak intensity was divided by the number of hydrogen atoms (three) contained in the vinyl group, so that an integral value A/3 of the peak intensity per one hydrogen atom in the vinyl group was obtained. Next, A/3 was multiplied by the molecular weight of 55 of a portion containing a vinyl group-a silicon atom (ref: the above-described general formula (10)), so that parts by mass A' of the portion containing a vinyl group-a silicon atom was obtained.

The obtained integral value B of the peak intensity was divided by the number of hydrogen atoms (three) contained in the methyl group, so that an integral value B/3 of the peak intensity per one hydrogen atom in the methyl group was obtained. Next, B/3 was multiplied by the molecular weight of 74 of a main chain portion to which the methyl group was bonded (ref: the above-described general formula (11)), so that parts by mass B' of the main chain portion to which the methyl group was bonded was obtained.

Since the parts by mass B' of the main chain portion to which the methyl group is bonded is approximated as the average molecular weight of the silicon-containing component, B'/A' (g/mol) serves as the number of grams of the silicon-containing component with respect to 1 mol of the vinyl group.

And, the reciprocal of B'/A' (g/mol), that is, A'/B' (mol/g) was calculated as the vinyl group equivalent (the number of moles of vinyl group per 1 g of the silicon-containing component). The results are shown in Table 1.

2. Evaluation of Appearance of Light Emitting Diode Device (Encapsulating Layer)

15 g of YAG:Ce was mixed with 75 g of a mixed solution (the mixing ratio (A/B)=1/1) which was obtained by mixing A liquid (an alkenyl group-containing polysiloxane) with B liquid (an organopolysiloxane containing no alkenyl group/ containing a hydrosilyl group) of an addition reaction curable type silicone resin composition (LR7665, manufactured by WACKER ASAHIKASEI SILICONE CO., LTD.) to be stirred at 25° C. for 1 hour, so that a phosphor-containing resin composition was prepared (the phosphor concentration of 15 mass %).

Next, the above-described phosphor-containing resin composition was applied on the upper surface of a release sheet (ref: FIG. 2 (a)) made of a polyester film (trade name: SS4C, manufactured by Nippa CO., LTD., a thickness of 50 μm) with a thickness of 100 μm to obtain a phosphor film. Then, the obtained phosphor film was dried at 100° C. for 10 minutes, so that a phosphor layer was formed on the release sheet (ref: FIG. 2 (b)).

Next, each of the silicone resin compositions in Examples and Comparative Examples was applied on the release sheet with a thickness of 500 μm to obtain an encapsulating film. Then, the obtained encapsulating film was dried at 100 to 150° C. for 5 to 30 minutes, so that the silicone resin composition was brought into a semi-cured state and therefore, an encapsulating layer was formed into a sheet shape (ref: FIG. 2 (c)).

As described above, an encapsulating sheet including the phosphor layer and the encapsulating layer was fabricated.

Next, the encapsulating sheet was disposed so that the encapsulating layer was opposed to a light emitting diode with respect to a board mounted with the light emitting diode (ref: FIG. 3 (a)). Then, the encapsulating sheet was hot pressed under hot pressing conditions of 160° C., 5 minutes, and 0.1 MPa, so that the encapsulating sheet was compressively bonded to the light emitting diode and the board.

In this way, the encapsulating layer was cured and the light emitting diode was encapsulated by the encapsulating layer. Next, the release sheet was peeled off (ref: phantom lines in FIG. 3 (b)).

As described above, a light emitting diode device was fabricated (ref: FIG. 3 (c)).

In each of the light emitting diode devices corresponding to Examples and Comparative Examples, an electric current of 250 mA was applied through the light emitting diode, so that the light emitting diode was allowed to continuously light up in a constant temperature and humidity chamber set to be at 85° C. and a relative humidity (RH) of 85%.

The encapsulating layer of the light emitting diode device 24 hours after the start of the continuous lighting up was observed visually to evaluate whether a bleeding was confirmed or not. The results are shown in Table 1. In Table 1, "Good" shows that a bleeding was not observed in the encapsulating layer and "Bad" shows that a bleeding was observed in the encapsulating layer.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. A silicone resin composition comprising:
a silicon-containing component including a silicon atom to which a monovalent hydrocarbon group selected from a saturated hydrocarbon group and an aromatic hydrocarbon group is bonded and a silicon atom to which an alkenyl group is bonded,
wherein the number of moles of alkenyl group per 1 g of the silicon-containing component is 200 to 2000 μmol/g,
the silicon-containing component is prepared from a material component comprising:
a silicon compound having an alkenyl group and a silanol condensation reactive functional group and being represented by the following general formula (1);
a polysiloxane having silanol groups at both ends and being represented by the following general formula (2);
an organopolysiloxane having a hydrosilyl group but no alkenyl group;
a silicon compound having an epoxy group and a silanol condensation reactive functional group and being represented by the following general formula (5);
a condensation catalyst; and
an addition catalyst, General Formula (1):

where, in general formula (1), $R^1$ represents an alkenyl group and $X^1$ represents a halogen atom, an alkoxy group, a phenoxy group, or an acetoxy group, $X^1$ may be the same or different from each other, General Formula (2):

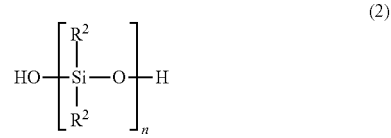

where, in general formula (2), $R^2$ represents a monovalent hydrocarbon group selected from a saturated hydrocarbon group and an aromatic hydrocarbon group, "n" represents an integer of 1 or more, General Formula (5):

where, in general formula (5), $R^5$ represents a group having an epoxy structure and $X^2$ represents a halogen atom, an

TABLE 1

| | Examples/Comparative Examples | | | | | | |
|---|---|---|---|---|---|---|---|
| | Example 1 | Example 2 | Example 3 | Comparative Example 1 | Comparative Example 2 | Comparative Example 3 | Comparative Example 4 |
| Vinyl Group Equivalent [μmol/g] | 450 | 840 | 300 | 50 | 160 | 80 | 130 |
| Appearance of Encapsulating Layer | Good | Good | Good | Bad | Bad | Bad | Bad | alkoxy group, a phenoxy group, or an acetoxy group, $X^2$ may be the same or different from each other.

2. An encapsulating material made of a silicone resin composition,
wherein the silicone resin composition comprises:
a silicon-containing component including a silicon atom to which a monovalent hydrocarbon group selected from a saturated hydrocarbon group and an aromatic hydrocarbon group is bonded and a silicon atom to which an alkenyl group is bonded, and
the number of moles of alkenyl group per 1 g of the silicon-containing component is 200 to 2000 μmol/g,
the silicon-containing component is prepared from a material component comprising:
a silicon compound having an alkenyl group and a silanol condensation reactive functional group and being represented by the following general formula (1);
a polysiloxane having silanol groups at both ends and being represented by the following general formula (2);
an organopolysiloxane having a hydrosilyl group but no alkenyl group;
a silicon compound having an epoxy group and a silanol condensation reactive functional group and being represented by the following general formula (5);
a condensation catalyst; and
an addition catalyst, General Formula (1):

where, in general formula (1), $R^1$ represents an alkenyl group and $X^1$ represents a halogen atom, an alkoxy group, a phenoxy group, or an acetoxy group, $X^1$ may be the same or different from each other, General Formula (2):

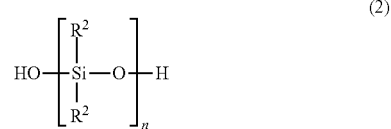

where, in general formula (2), $R^2$ represents a monovalent hydrocarbon group selected from a saturated hydrocarbon group and an aromatic hydrocarbon group, "n" represents an integer of 1 or more, General Formula (5):

where, in general formula (5), $R^5$ represents a group having an epoxy structure and $X^2$ represents a halogen atom, an alkoxy group, a phenoxy group, or an acetoxy group, $X^2$ may be the same or different from each other.

3. The encapsulating material according to claim 2, wherein
the encapsulating material is in a semi-cured state.

4. The encapsulating material according to claim 2, wherein
the encapsulating material is formed into a sheet shape.

5. A light emitting diode device comprising:
a light emitting diode element and
an encapsulating layer which is formed from an encapsulating material and encapsulates the light emitting diode element, wherein
the encapsulating material is made of the silicone resin composition of claim 1.

\* \* \* \* \*